United States Patent
Wang et al.

(10) Patent No.: US 11,509,293 B2
(45) Date of Patent: Nov. 22, 2022

(54) FOOTPRINT FOR MULTI-BIT FLIP FLOP

(71) Applicant: TAIWAN SEMICONDUCTOR MANUFACTURING CO., LTD., Hsinchu (TW)

(72) Inventors: Po-Chun Wang, Hsinchu (TW); Hui-Zhong Zhuang, Kaohsiung (TW); Chih-Liang Chen, Hsinchu (TW); Jerry Chang-Jui Kao, Taipei (TW); Tzu-Ying Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/900,765

(22) Filed: Jun. 12, 2020

(65) Prior Publication Data
US 2021/0391850 A1    Dec. 16, 2021

(51) Int. Cl.
| | |
|---|---|
| *H01L 27/02* | (2006.01) |
| *H03K 3/037* | (2006.01) |
| *G01R 31/3187* | (2006.01) |
| *H01L 29/66* | (2006.01) |
| *H01L 29/417* | (2006.01) |

(52) U.S. Cl.
CPC ......... *H03K 3/037* (2013.01); *G01R 31/3187* (2013.01); *H01L 27/0207* (2013.01); *H01L 29/41791* (2013.01); *H01L 29/66795* (2013.01)

(58) Field of Classification Search
CPC ........... H01L 27/0207; H01L 29/41791; H01L 29/66795
See application file for complete search history.

(56) References Cited

U.S. PATENT DOCUMENTS

| | | | |
|---|---|---|---|
| 8,723,574 B2 | 5/2014 | Tomita | |
| 8,856,704 B2 | 10/2014 | Baeg | |
| 9,966,936 B2 | 5/2018 | Kim et al. | |
| 2017/0317666 A1 | 11/2017 | Liu et al. | |
| 2019/0148407 A1 | 5/2019 | Guo et al. | |
| 2020/0104462 A1 | 4/2020 | Chen et al. | |
| 2020/0243502 A1* | 7/2020 | Kim | H01L 27/11807 |
| 2021/0344346 A1* | 11/2021 | Sio | H03K 19/1774 |

FOREIGN PATENT DOCUMENTS

| | | |
|---|---|---|
| KR | 20170124429 A | 11/2017 |
| KR | 20190054889 A | 5/2019 |
| KR | 20200037108 A | 4/2020 |
| TW | 201740682 A | 11/2017 |
| TW | 201834185 A | 9/2018 |
| TW | 201919239 A | 5/2019 |
| TW | 202010017 A | 3/2020 |

* cited by examiner

*Primary Examiner* — Fernando L Toledo
*Assistant Examiner* — Valerie N Newton
(74) *Attorney, Agent, or Firm* — Maschoff Brennan

(57) ABSTRACT

An integrated circuit disclosed here includes a first plurality of cell rows, a second plurality of cell rows, first and second clock inverters, and a plurality of flip-flops. The second plurality of cell rows are arranged abutting the first plurality of cell rows. A first number of fins in the first plurality of cell rows is different from a second number of fins in the second plurality of cell rows. The first and second clock inverters are arranged in the second plurality of cell rows. The plurality of flip-flops are arranged in the first plurality of cell rows and the second plurality of cell rows. The plurality of flip-flops include a first plurality of flip-flops configured to operate in response to the first clock and second clock signals.

20 Claims, 17 Drawing Sheets

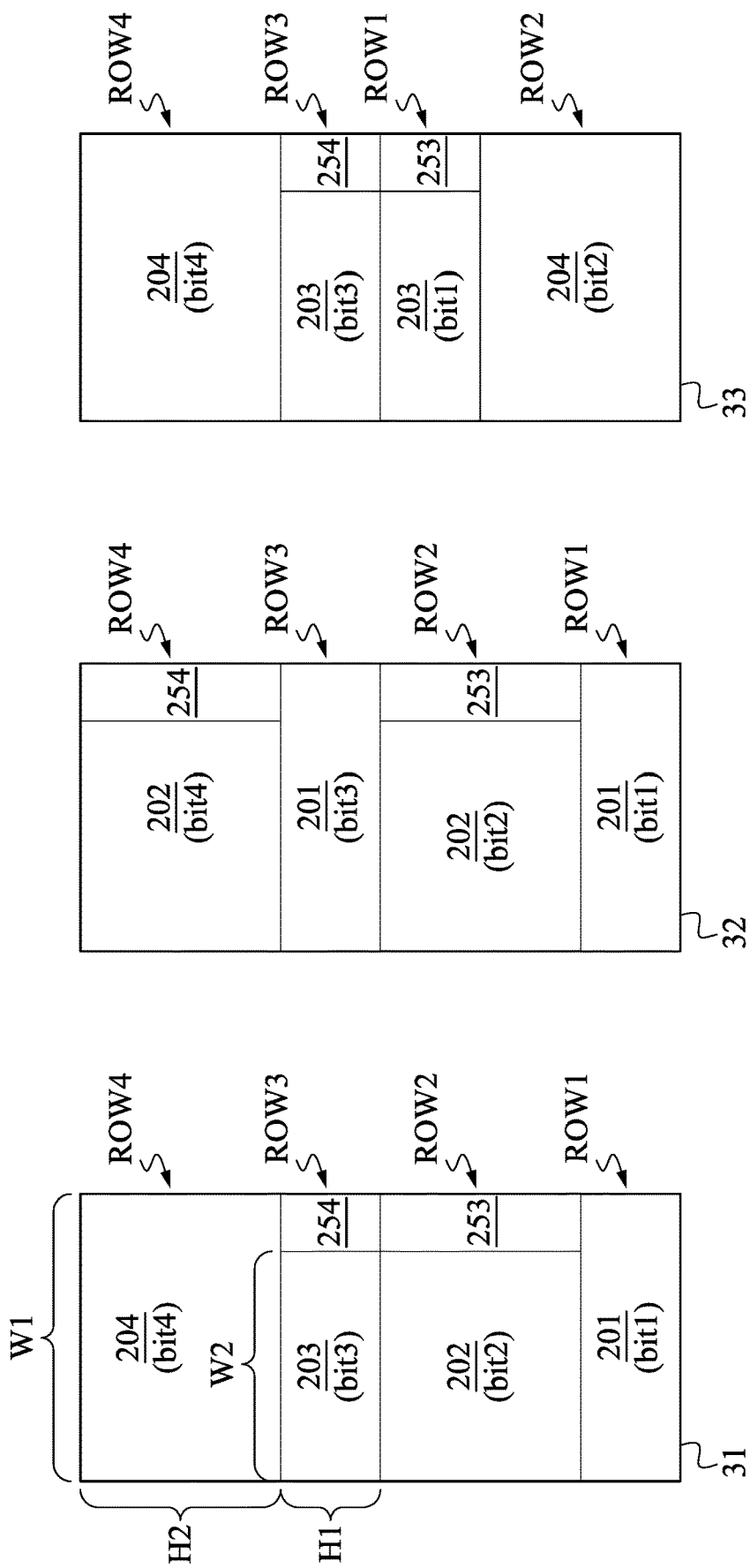

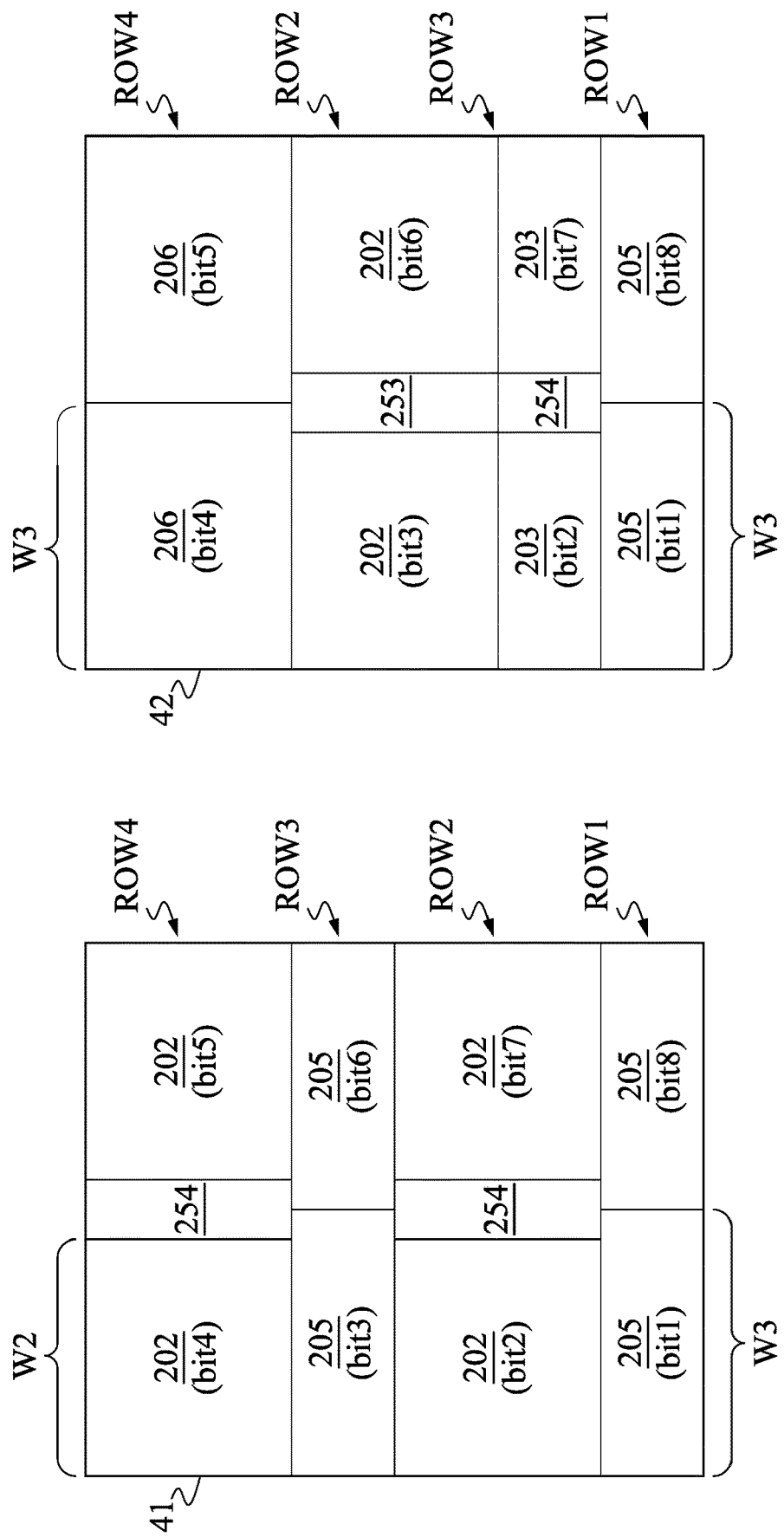

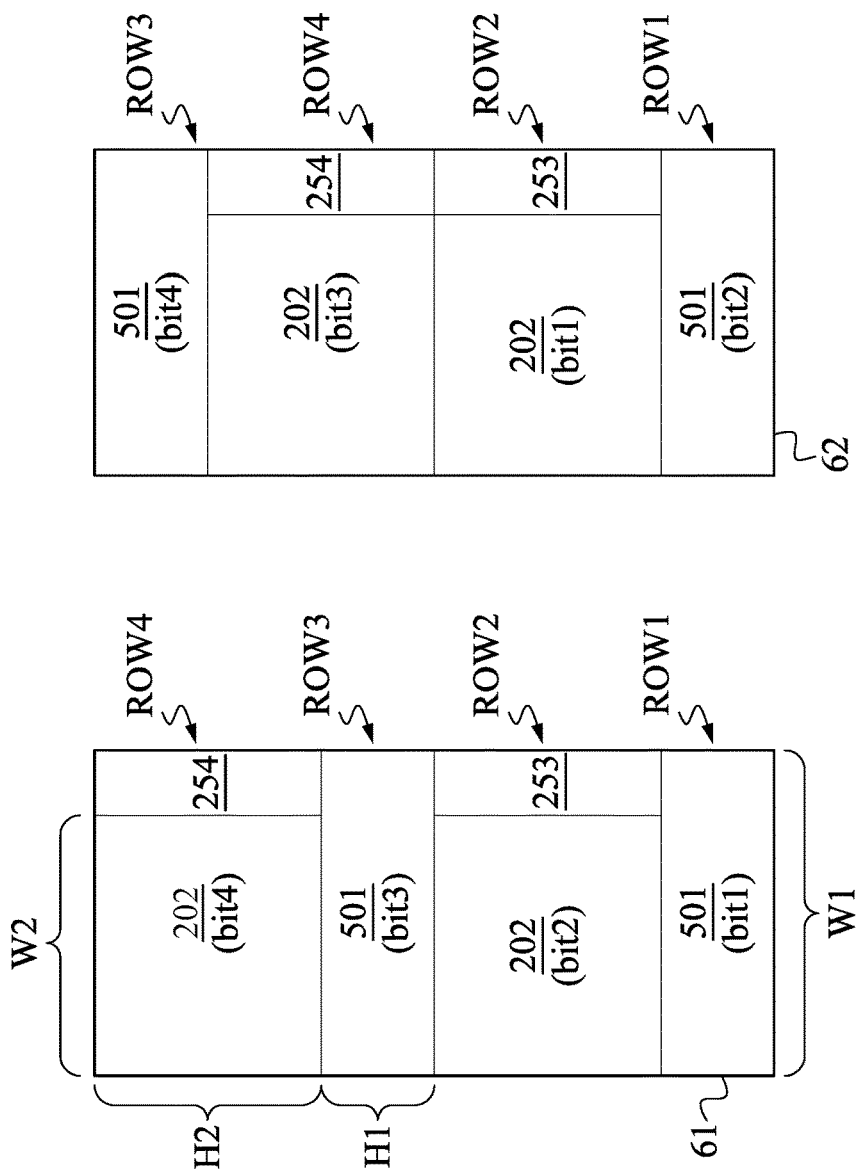

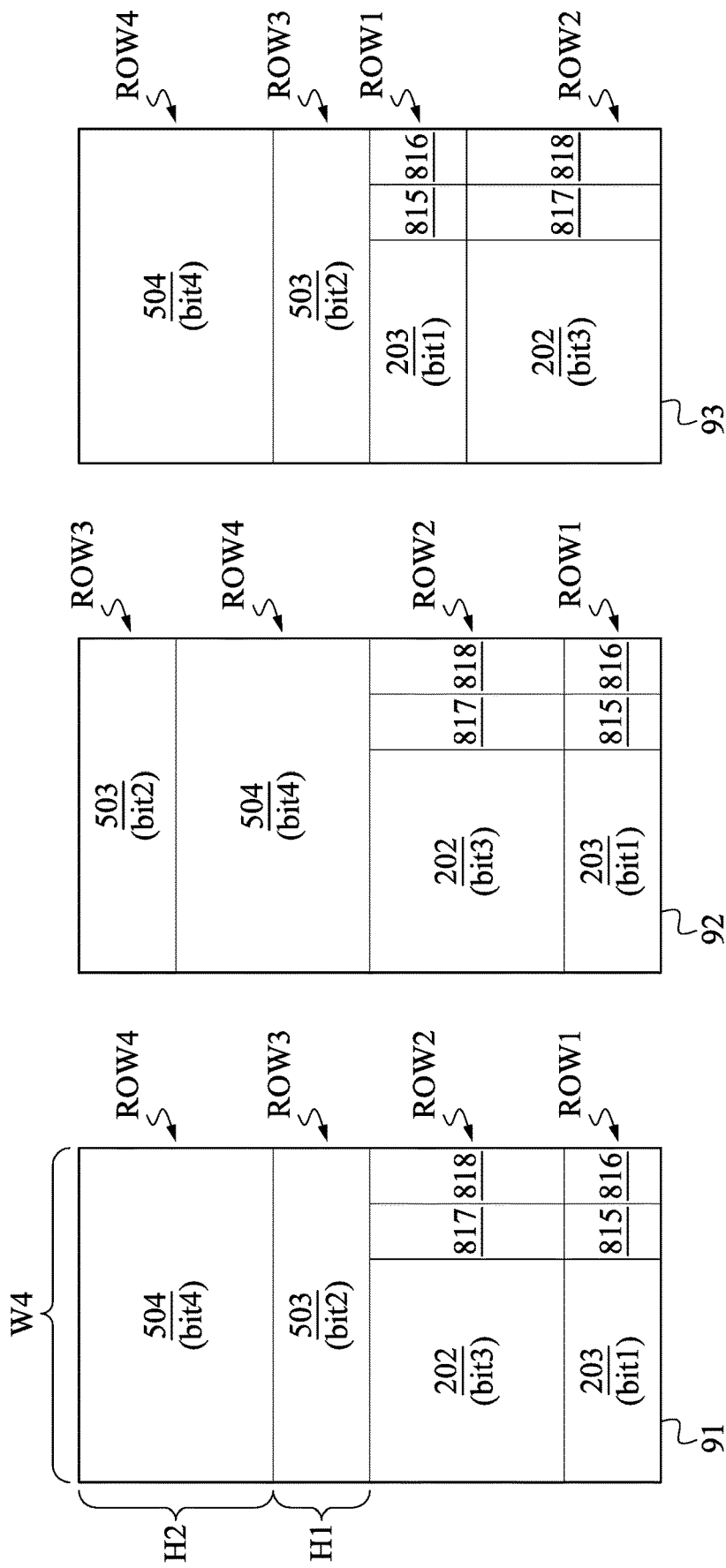

FOOTPRINT FOR MULTI-BIT FLIP FLOP

BACKGROUND

Multi-bit flip-flop circuits are utilized in electronic systems to store digital data. Scan flip-flops included in the multi-bit flip-flop operate to store many bits of data in response to clock signals. In some approaches, the multi-bit flip-flop circuits are based on circuitry with similar circuit topology and sizing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are floor planning or layout views of several the scan flip-flops of FIGS. 2A-2B included in 4-bit flip-flop circuits in the semiconductor device of FIG. 1A, in accordance with some embodiments.

FIGS. 4A-4B are floor planning or layout views of several the scan flip-flops of FIGS. 2A-2B included in 8-bit flip-flop circuits in the semiconductor device of FIG. 1A, in accordance with some embodiments.

FIGS. 6A-6C are floor planning or layout views of several the scan flip-flops of FIGS. 2A-2B and several the scan flip-flops of FIGS. 5A-5B that are included in 4-bit flip-flop circuits in the semiconductor device of FIG. 1A, in accordance with some embodiments.

FIGS. 7A-7B are floor planning or layout views of several the scan flip-flops of FIGS. 2A-2B and several the scan flip-flops of FIGS. 5A-5B included in 8-bit flip-flop circuits in the semiconductor device of FIG. 1A, in accordance with some embodiments.

FIGS. 9A-9C are floor planning or layout views of the first set of scan flip-flops and the second set of scan flip-flops that are included in 4-bit flip-flop circuits in the semiconductor device of FIG. 1A, in accordance with some embodiments.

DETAILED DESCRIPTION

Figure 1A:
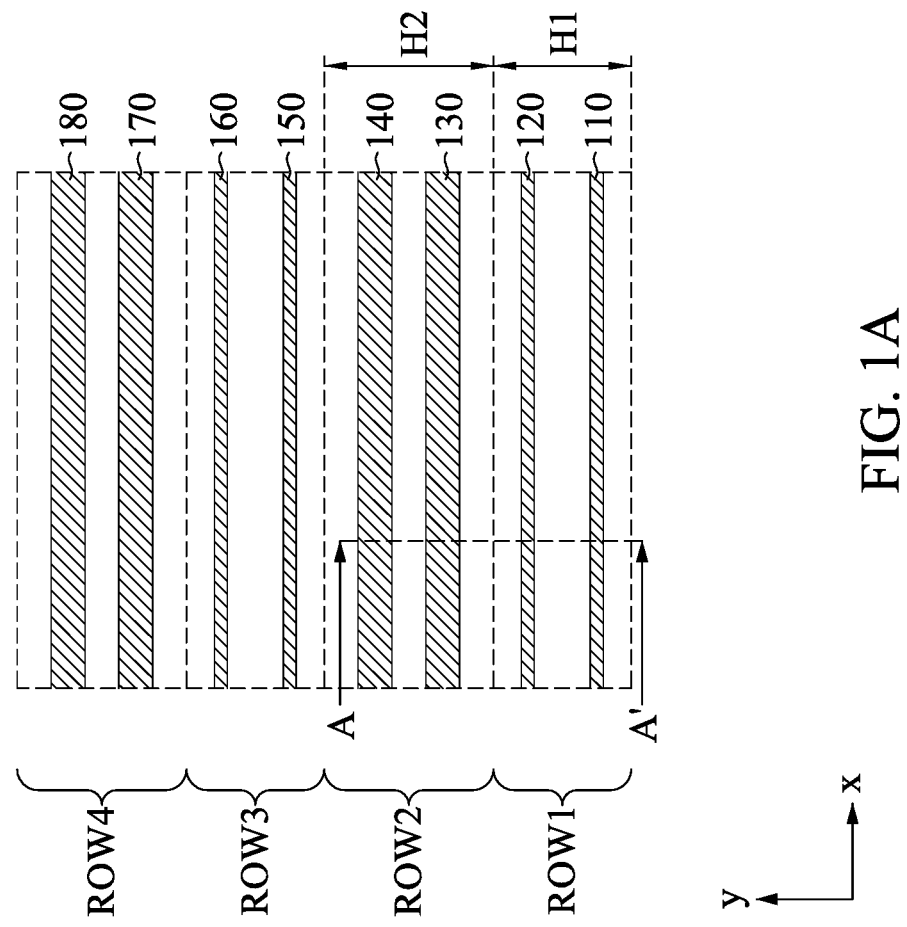
FIG. 1A is a top view diagram of part of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1A. FIG. 1A is a top view diagram of part of a semiconductor device 10, in accordance with some embodiments. As illustratively shown in FIG. 1A, the semiconductor device 10 includes several cell rows ROW1-ROW4. In some embodiments, there are cells, for example, cells illustrated in FIGS. 3A-3F, 4A-4B, 6A-7B, 9A-10, are implemented by integrated circuits arranged in these cell rows ROW1-ROW4. The number of the cell rows ROW1-ROW4 in the semiconductor device 10 in FIG. 1A is given for illustrative purposes. Various numbers of the cell rows ROW1-ROW4 are within the contemplated scope of the present disclosure. For example, in some embodiments, the number of the cell rows in the semiconductor device 10 is more than 4.

For illustration, the cell rows ROW1-ROW4 extend along x direction and are parallel to each other. In some embodiments, the cell rows ROW1-ROW4 are arranged along y direction, which is substantially perpendicular to the x direction.

In some embodiments, there are two groups of cell rows among the rows ROW1-ROW4 in reference with their row heights. As illustratively shown in FIG. 1A, each of the cell rows ROW1 and ROW3 is configured to have a row height H1, and each of the cell rows ROW2 and ROW4 is configured to have another row height H2, which is shorter than the row height H1. The cell rows ROW1 and ROW3 with the row height H1 are regarded as a first group "A" of the cell rows ROW1-ROW4, and the cell rows ROW2 and ROW4 are regarded as a second group "B" of the cell rows ROW1-ROW4. In some embodiments, as depicted in FIG. 1A, the first group A of the cell rows and the second group B of the cell rows are interlaced.

For illustration, the cell row ROW1 with the row height H1 in the first group "A" includes two active areas 110-120, and the cell row ROW2 with the row height H2 in the second group "B" includes two active areas 130-140. Similarly, the cell row ROW3 includes two active areas 150-160, and the cell row ROW4 includes two active areas 170-180. For illustration, the active areas 110-180 extend along x direction and are separate from each other in y direction. The configurations of the active areas 110-180 will be discussed in the following paragraphs with FIG. 1B.

In some embodiments, the active areas 110 and 140 have a conductivity of P type, while the active areas 120 and 130 have a conductivity of N type. The configurations of the active areas 150 and 180 are similar to the active areas 110 and 140, and the configurations of the active areas 160 and 170 are similar to the active areas 120 and 130. Alternatively stated, the cell rows ROW1-ROW4 are interlaced in a periodic sequence along y direction. The configurations of the active areas 110-180 are given for illustrative purposes. Various implements of the active areas 110-180 are included in the contemplated scope of the present disclosure. For example, in some embodiments, the active areas 110, 140, 150, and 180 are N type and the active areas 120, 130, 160 and 170 are P type.

The configurations of the semiconductor device 10 of FIG. 1A are given for illustrative purposes. Various implements of the semiconductor device 10 are includes in the contemplated scope of the present disclosure. For example, in some embodiments discussed in the following paragraphs, the cell rows are arranged in sequence different from the cell rows ROW1 to ROW4, such like, in sequence ROW1, ROW2, ROW4, and ROW3. Alternatively stated, the cell rows having the same height are arranged abutted each other.

Figure 1B:
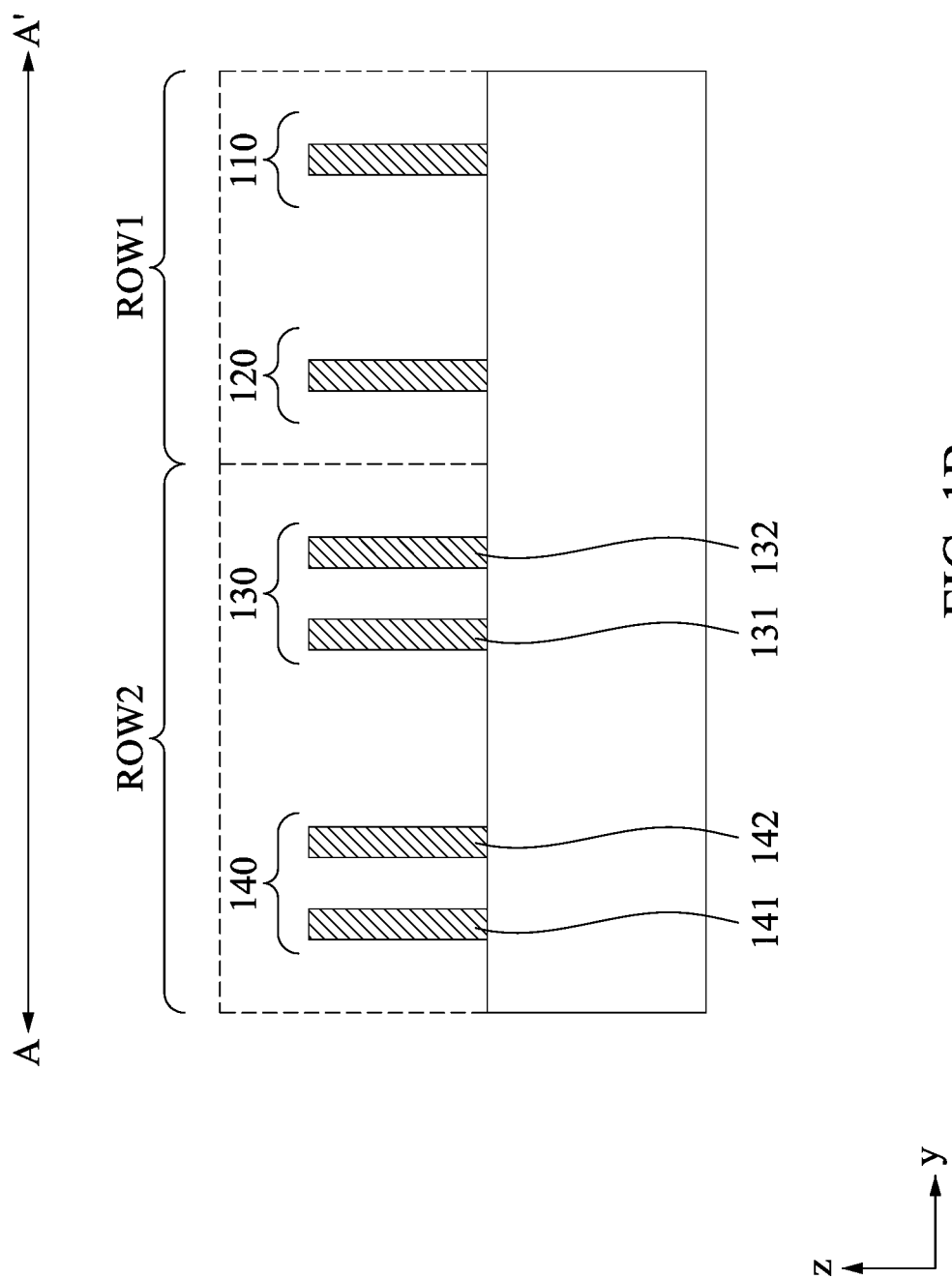
FIG. 1B is a sectional view diagram illustrating a structure of some cell rows along a sectional line in FIG. 1A in accordance with some embodiments.

Reference is now made to FIG. 1B. FIG. 1B is a sectional view diagram illustrating a structure of the cell rows ROW3-ROW4 along a sectional line AA' in FIG. 1A in accordance with some embodiments. With respect to the embodiments of FIG. 1A, like elements in FIG. 1B are designated with the same reference numbers for ease of understanding.

As illustratively shown in FIG. 1B, the cell row ROW1 with the row height H1 in the second group "A" includes two active areas 110-120 on the substrate Sub. The active area 110 of the cell row ROW1 includes a first one fin-shaped structure, and the active area 120 of the cell row ROW1 includes a second one fin-shaped structure. Alternatively stated, each one of the active areas 110-120 includes one fin-shaped structure.

As illustratively shown in FIG. 1B, the cell row ROW2 with the row height H1 in the first group "B" includes the active areas 130-140 on a substrate Sub. The active area 130 of the cell row ROW2 includes two fin-shaped structures 131 and 132, and the active area 140 of the cell row ROW2 includes another two fin-shaped structures 141 and 142. Alternatively stated, each one of the active areas 130-140 include two fin-shaped structures, such as 131 and 132, or 141 and 142.

In some embodiments, the fin-shaped structures 131 and 132 are n-type fin-shaped structures, and the fin-shaped structures 141 and 142 are p-type fin-shaped structures. In some other embodiments, the fin-shaped structures 131 and 132 are p-type fin-shaped structures, and the fin-shaped structures 141 and 142 are n-type fin-shaped structures.

The fins mentioned above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, such an active area may include one or more fin-shaped structures of one or more three-dimensional field-effect-transistors (e.g., FinFETs, gate-all-around (GAA) transistors), or an oxide-definition (OD) region of one or more planar metal-oxide-semiconductor field-effect transistors (MOSFETs). The active region may serve as a source feature or a drain feature of the respective transistor (s).

In some embodiments, the active area 130 of the cell row ROW2 includes two fin-shaped structures 131 and 132 together as an active region to form an integrated circuit component (such as a transistor), such that an equivalent width of the active region of the integrated circuit component disposed on the active area 130 will be wider than one of another integrated circuit component disposed on the active area 110, which includes the first one fin-shaped structure. Alternatively stated, in some embodiments, integrated circuit components disposed on the cell row ROW2 have a better performance than integrated circuit components disposed on the cell row ROW1.

Figure 2A:
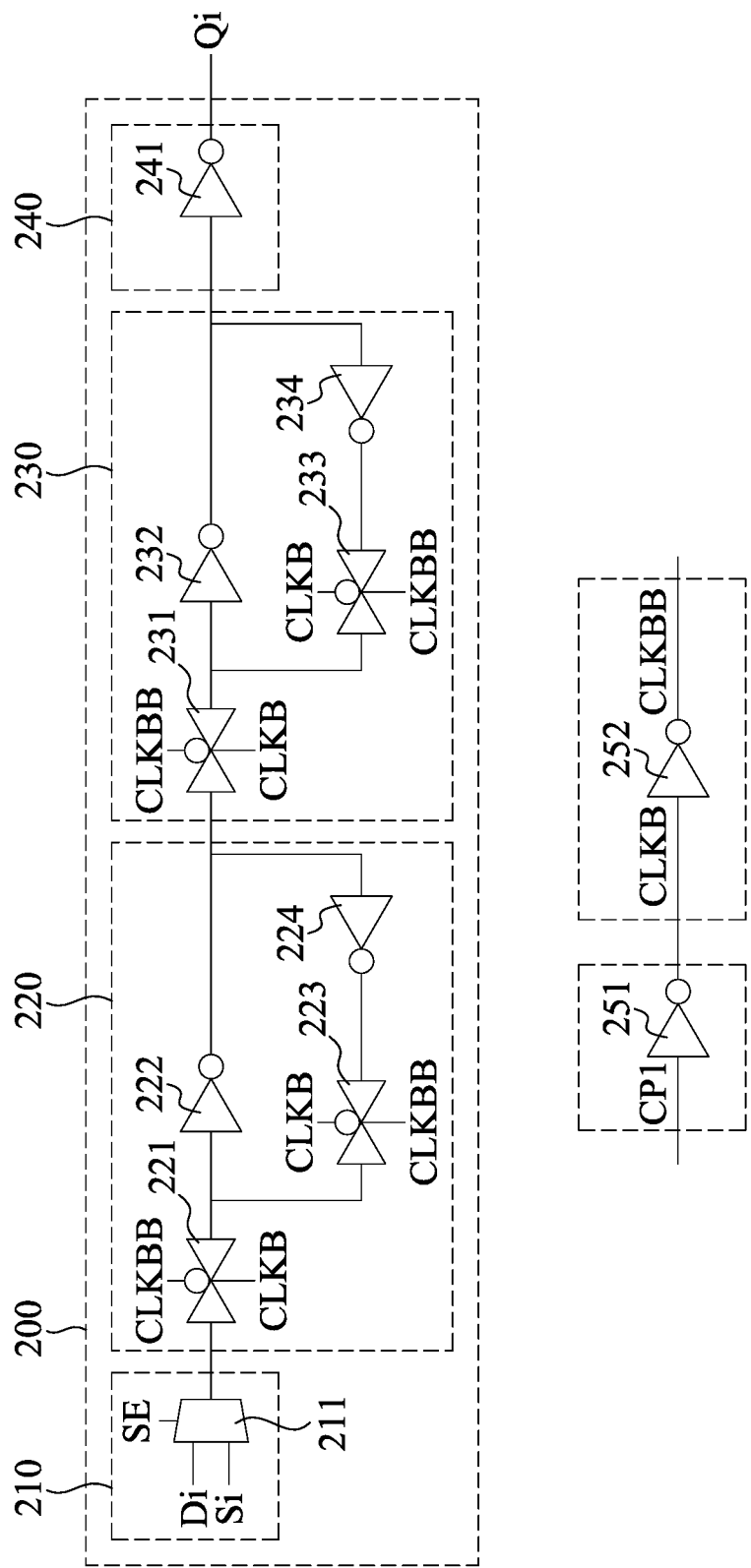
FIG. 2A is a schematic diagram of part of a scan flip-flop, in accordance with some embodiments.

Reference is now made to FIG. 2A. FIG. 2A is a schematic diagram of part of a scan flip-flop 200 and corresponding inverters 251-252, in accordance with some embodiments. In some embodiments, the scan flip-flop 200 is formed in the semiconductor device 10 of FIG. 1A. For illustration, the scan flip-flop 200 includes a mux input circuit 210, a first latch circuit 220, a second latch circuit 230, and an output stage 240. The mux input circuit 210 is coupled to the first latch circuit 220. The first latch circuit 220 is coupled to the second latch circuit 230. The second latch circuit 230 is coupled to the output stage 240.

In operation, the mux input circuit 210 is configured to receive a scan data input SI, a data input Di and a scan enable signal SE and output the scan data input SI or the normal data input Di. The first and second latch circuits 220-230 are configured to receive clock signals CLKB and CLKBB and to be cross-coupled to store a data state. The clock signal CLKB is generated by the inverter 251 inverting a clock signal CP1, and the clock signal CLKBB is generated by the inverter 252 inverting the clock signal CLKB. The output stage 240 is configured to generate an output data signal Qi based on the output of the second latch circuit 230. In some embodiments, the output signal Qi is associated with the output signal of the mux input circuit 210, the data state stored in the first and second latch circuits 220-230 and the clock signals CLKB and CLKBB.

Specifically, the mux input circuit 210 includes a multiplexer (MUX) 211. The MUX 211 is configured to output the scan data input SI or the data input Di in accordance of the scan enable signal SE. In some embodiments, there are several scan flip-flops, configured with respect to the scan flip-flop 200, configured to receive a multi-bit data signal, and the data input Di corresponds to the i-th bit data of the multi-bit data signal. For example, the scan flip-flops receive a 4-bit signal, and accordingly, data inputs D1-D4 correspond to the first to fourth-bit data of the 4-bit signal.

In some embodiments, the scan enable signal SE received by the MUX 211 switches the scan flip-flop 200 between a normal operation mode and a scan test mode. For example, when the scan enable signal SE is raised to a high logic level (i.e., logic 1) and the scan flip-flop 200 operates in the scan test mode, the scan data input SI is output by the MUX 211. When the scan enable signal SE is pulled down to a low logic level (i.e., logic 0) and the scan flip-flop 200 operates in the normal operation mode, the data input Di is output by the MUX 211.

For illustration, the first latch circuit 220 includes transmission gates 221 and 223 and inverters 222 and 224. The transmission gate 221 receives the clock signals CLKB and CLKBB. The inverters 222 and 224 and the and transmission gate 223 form a latch that includes the inverter 222 coupled in a forward path between the transmission gate 221 and an output terminal of the first latch circuit 220, and the inverter 224 coupled in a feedback configuration and the transmission gate 223 enabled and disabled by the clock signals CLKB and CLKBB.

Similarly, the second latch circuit 230 includes transmission gates 231 and 233 and inverters 232 and 234. The transmission gate 231 receives the clock signals CLKB and CLKBB. The inverters 232 and 234 and the and transmission gate 233 form a latch that includes the inverter 232 coupled in a forward path between the transmission gate 231 and an output terminal of the second latch circuit 230, and the inverter 234 coupled in a feedback configuration and the transmission gate 233 enabled and disabled by the clock signals CLKB and CLKBB.

The output stage 240 includes an inverter 241. The inverter 241 is coupled to an output of the second latch circuit 230. The inverter 241 is configured to output the output signal of the second latch circuit 230 and generate the output data signal Qi.

As mentioned above, in some embodiments, the data input Di corresponds to the i-th bit data of the multi-bit data signal. Accordingly, the output data signal Qi corresponds to i-th bit data of the multi-bit data signal. Furthermore, in alternative embodiments, the output data signal Qi of the i-th bit flip-flop is input as the scan data input SI(i+1) along with the data input D(i+1) to the (i+1)-th bit flip-flop, and so on. In some embodiments, all the scan flip-flops in a multi-bit flip-flop circuit receive the same scan data input.

In some embodiments, the output data signal Qi "flips" and "flops" between a "1" and a "0" in a manner that depends on the output of the mux input circuit 210 and the clock signal CP1. Generally, the stored data state in the scan flip-flop 200 is output as the output data signal Qi until a logic state of the clock signal CP1 changes. When the logic state of the clock signal CP1 changes, the present state of the output signal of the mux input circuit 210 is stored and delivered as the output data signal Qi. For example, in some embodiments, the initial stored state in the scan flip-flop is "1". When the state of the clock signal CP1 changes and the state of the output signal of the mux input circuit 210 is still "1", state "1" is stored for another clock cycle. In contrast, when the state of the clock signal CP1 changes and the state of the output signal of the mux input circuit 210 is "0", state "0" is stored for the ensuing clock cycle and correspondingly the output data signal Qi having a state "0" is output.

The configurations of FIG. 2A are given for illustrative purposes. Various implements of FIG. 2A are within the contemplated scope of the present disclosure. For example, in some embodiments, the transmission gate 223 of the first latch circuit 220 and the transmission gate 233 of the second latch circuit 230 are omitted.

Figure 2B:
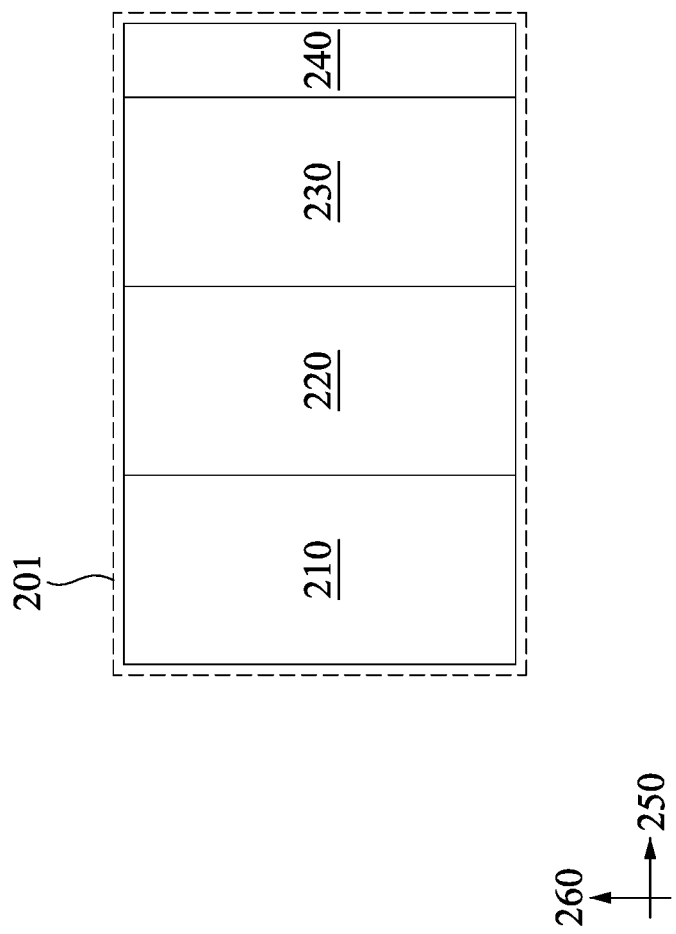
FIG. 2B is a layout view of the scan flip-flop of FIG. 2A, in accordance with some embodiments.

Reference is now made to FIG. 2B. FIG. 2B is a layout view of the scan flip-flop 200 of FIG. 2A, in accordance with some embodiments. With respect to FIG. 2A, like elements in FIG. 2B are designated with the same reference numbers for ease of understanding.

In some embodiments, a cell 201 is configured in the formation of the scan flip-flop 200 of FIG. 2A. As illustratively shown in FIG. 2B, the cell 201 includes the mux input circuit 210, the first latch circuit 220, the second latch circuit 230, and the output stage 240 that are arranged along a cell boundary direction 250. The configurations of the cell 201 corresponding to the scan flip-flop 200 are given for illustrative purposes. Various implements of the cell 201 are within the contemplated scope of the present disclosure. For example, in some embodiments, the mux input circuit 210, the first latch circuit 220, the second latch circuit 230, and the output stage 240 are arranged along both two cell boundary directions 250 and 260.

FIGS. 3A-3F are floor planning or layout views of several the scan flip-flops of FIGS. 2A-2B included in 4-bit flip-flop circuits 31-33 in the semiconductor device 10 of FIG. 1A, in accordance with some embodiments. In some embodiments, cells, included in the multi-bit flip-flop circuits 31-36, having a cell height H1 are arranged in rows, for example, the cell rows ROW1 and ROW3 of FIG. 1A. Similarly, the cells, included in the multi-bit flip-flop circuits 31-36, having a cell height H2 are arranged in rows, for example, the cell rows ROW2 and ROW4 of FIG. 1A. Alternatively stated, the cells having the cell height H1 are implemented in the high fin (including at least two fins in an active area) rows, and the cells having the cell height H2 are implemented in the low fin (including one fin in an active area) rows.

In some embodiments, the cell rows ROW1-ROW4 are arranged in sequences different from FIG. 1A to implement the corresponding the flip-flop circuits 31-36.

Reference is now made to FIG. 3A. The 4-bit flip-flop circuit 31 includes cells 201-204 and 253-254. The cells 202-204 are configured with respect to, for example, the cell 201. In some embodiments, the cells 201-204 have the same equivalent circuit including, for example, the scan flip-flop 200 of FIG. 2A.

The cells 201-204 correspond to bit 1 to bit 4 scan flip-flops separately (as shown in FIG. 3A). In alternative embodiments, the output data signal Qi in the cell 201 of bit 1 is input as the scan data input SI for the cell 202 of bit 2. The output data signal Qi in the cell 202 of bit 2 is input as the scan data input SI for the cell 203 of bit 3. The output data signal Qi in the cell 203 of bit 3 is input as the scan data input SI for the cell 204 of bit 4. The cells 253 and 254 correspond to the inverters 251 and 252 of FIG. 2A respectively. In some embodiments, the scan flip-flops of the cells 201-204 operate in response to the clock signal CLKB generated by the inverter 251 of the cell 253 and the clock signal CLKBB generated by the inverter 252 of the cell 254.

For illustration, the cell 201 of bit 1 is arranged in the cell row ROW1 and has a width W1. The cells 202 of bit 2 and 253 are arranged in the cell row ROW2. The cell 202 of bit 2 has a width W2 smaller than the width W1 and abuts the cell 253. The cells 203 of bit 3 and 254 are arranged in the cell row ROW3. The cell 203 of bit 3 has the width W2 and abuts the cell 254. The cell 204 of bit 4 is arranged in the cell row ROW4 and has the width W1. The cells 253-254 abut one another.

In some embodiments, transistors of the cells 201-204 included in the scan flip-flop circuit 31 shares gate structures in the layout view. For example, in various embodiments, at least one gate structure is configured to be in the formation of the inverter 222 in the cell 201 and the transmission gate 223 in the cell 202. Alternatively stated, due to the shared gate structures, cells in the cell row having smaller cell height, such like the cell rows ROW1 and ROW3, save routing resource for connecting gates, and further, the cells are capable to include complex circuits (more circuit elements) within relatively smaller area of cells, compared with that of cells in the cell rows having larger row height. The configurations mentioned above are given for illustrative purposes. Various implements are included in the contemplated scope of the present disclosure. For example, in some embodiments, the inverters in the cells 253-254 share gate or other layout structures (i.e., conductive patterns MD configured to be drain or source terminals of transistors) with elements in the cells 201-204.

In addition, in some approaches, each bit of a multi-bit flip-flop circuit has similar circuit topology and sizing. Accordingly, the functionality of each bit is the same, and the timing characteristics are very similar. Compared with the approaches, with the configurations of the present disclosure, bits of the multi-bit flip-flop circuit are arranged in mixed row height structures, and therefore the flexibility of topology and device sizing are provided. Moreover, because the constraint of having the same topology and sizing to bits of multi-bit flip-flop circuit has been removed, area overhead of implementing the multi-bit flip-flop circuit in mix row cell architecture is also removed. Accordingly, the better power, performance, and area usage of the multi-bit flip-flop circuit are achieved in the present disclosure, compared with some approaches.

Reference is now made to FIG. 3B. With respect to FIG. 3A, like elements in FIG. 3B are designated with the same reference numbers for ease of understanding.

Compared with FIG. 3A, instead of arranging the cell 254 in the cell row ROW3, the cell 254 of the multi-bit flip-flop circuit 32 is arranged in the cell row ROW4 and abuts the cell 202 of bit 4.

With the configurations of FIG. 3B, because the cells 202 of bit 2 and 202 of bit 4 are arranged in the cell rows ROW2 and ROW4 that have 2-fin structure as mention in FIG. 1A, scan flip-flops operating with higher computing speed are formed within the cell rows ROW2 and ROW4, compared with scan flip-flops, formed within the cell rows ROW1 and ROW3, operating with lower computing speed. Alternatively stated, the scan flip-flops in the multi-bit flip-flop circuit operate in different speeds. In some embodiments, the speed of the multi-bit flip-flops is not dominated by the scan flip-flops operating with lower computing speed.

Reference is now made to FIG. 3C. With respect to FIGS. 3A-3B, like elements in FIG. 3C are designated with the same reference numbers for ease of understanding.

Compared with FIG. 3A, instead of having the cell 201 of bit 1 in the cell row ROW1 and the cell 202 of bit 2 in the cell row ROW2, the multi-bit flip-flop circuit 33 includes the cell 204 of bit 2 arranged in the cell row ROW2 and the cell 203 of bit 1 in the cell row ROW1. The cell 203 of bit 1 abuts the cell 253. Alternatively stated, the cells 203 of bit 1 and 203 of bit 3 are arranged interposed between the cells 204 of bit 2 and 204 of bit 4. To explain in another way, the cell rows ROW1 and ROW3 are arranged interposed between the cell rows ROW2 and ROW4.

Figure 3E:
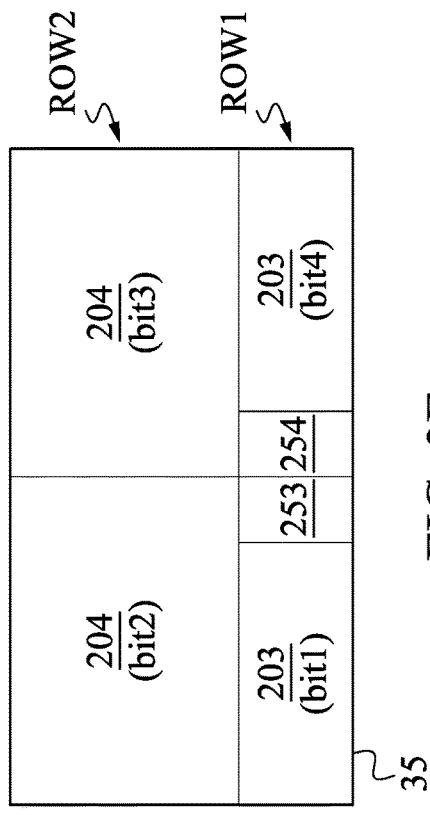
Figure 3D:
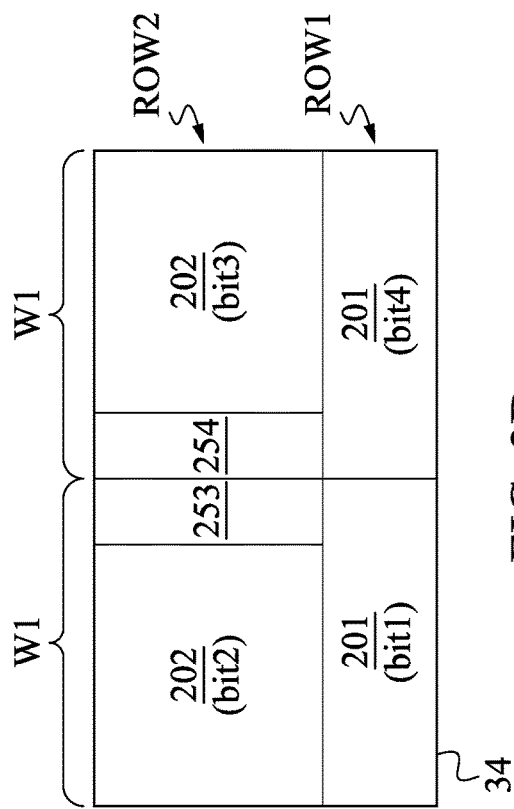

Reference is now made to FIG. 3D. With respect to FIGS. 3A-3C, like elements in FIG. 3D are designated with the same reference numbers for ease of understanding.

Compared with FIG. 3A, instead of arranging the cells of bit 3 and bit 4 vertically in the cell of the multi-bit flip-flop circuit 31, the multi-bit flip-flop circuit 34 includes the cell 202 of bit 3 and the cell 254 that are arranged in the cell row ROW2. Alternatively stated, the cells 253-254 are arranged interposed between the cells 202 of bit 2 and 202 of bit 3. The multi-bit flip-flop circuit 34 further includes the cell 201 of bit 4 in the cell row ROW1. The cell 201 of bit 4 abuts the cell 201 of bit 1. In some embodiments, the cells of bit 1 to bit 4 are arranged clockwise in the cell corresponding to the multi-bit flip-flop circuit 34.

Reference is now made to FIG. 3E. With respect to FIGS. 3A-3D, like elements in FIG. 3E are designated with the same reference numbers for ease of understanding.

Compared with FIG. 3D, instead of arranging the cells 253-254 in the cell row ROW2, the multi-bit flip-flop circuit 35 includes the cells 253-254 that are in the cell row ROW1 and arranged interposed between the cells 203 of bit 1 and 203 of bit 4. As shown in FIG. 3D, the multi-bit flip-flop circuit 35 further includes the cells 204 of bit 2 and 204 of bit 3 that are in the cell row ROW2 and abut each other.

Figure 3F:
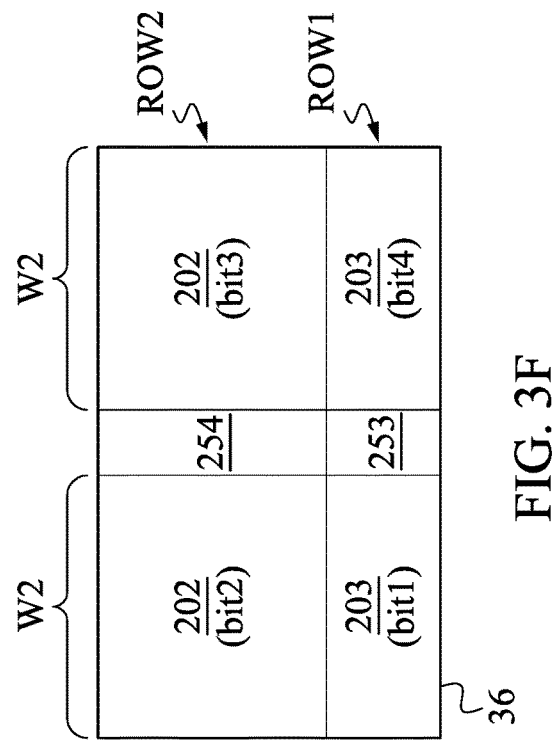

Reference is now made to FIG. 3F. With respect to FIGS. 3A-3E, like elements in FIG. 3F are designated with the same reference numbers for ease of understanding.

Compared with FIG. 3E, instead of having the cells 253-254 in the same cell row, the multi-bit flip-flop circuit 36 includes the cell 253 in the cell row ROW1 and the cell 254 in the cell row ROW2. As shown in FIG. 3F, the multi-bit flip-flop circuit 36 includes the cells 203 of bit 1 and 203 of bit 4 in the cell row ROW1 and the cells 202 of bit 2 and 202 of bit 3 in the cell row ROW2. The cell 253 is arranged interposed between the cells 203 of bit 1 and 203 of bit 4, and the cell 254 is arranged interposed between the cells 202 of bit 2 and 202 of bit 3. The cells 253-254 abut each other.

FIGS. 4A-4B are floor planning or layout views of several the scan flip-flops of FIGS. 2A-2B included in 8-bit flip-flop circuits 41-42 in the semiconductor device of FIG. 1A, in accordance with some embodiments. With respect to FIGS. 3A-3F, like elements in FIGS. 4A-4B are designated with the same reference numbers for ease of understanding.

Reference is now made to FIG. 4A. Compared with FIG. 3B, the multi-bit flip-flop 41 includes cells corresponding to bit 5 to bit 8. For illustration, the multi-bit flip-flop 41 includes cells 205 of bit 1, 205 of bit 3, 205 of bit 6, and 205 of bit 8, in which each has a width W3, smaller than the width W1 and larger than the width W2, and the cell height H1. In some embodiments, the cells 205 of bit 1, 205 of bit 3, 205 of bit 6, and 205 of bit 8 are configured with respect to, for example, the cell 201 of FIG. 2B. In some embodiments, the cells 205 of multi bits have the same equivalent circuit including, for example, the scan flip-flop 200 of FIG. 2A.

Specifically, the cell 205 of bit 1 and the cell 205 of bit 8 are arranged in the cell row ROW1. The cell 202 of bit 2, the cell 253, and the cell 202 of bit 7 are arranged in the cell row ROW2. The cell 205 of bit 3 and the cell 205 of bit 6 are arranged in the cell row ROW3. The cell 202 of bit 4, the cell 254, and the cell 202 of bit 5 are arranged in the cell row ROW4. In some embodiments, the cells of bit 1 to bit 8 are arranged clockwise in the cell corresponding to the multi-bit flip-flop circuit 41.

Reference is now made to FIG. 4B. Compared with FIG. 4A, the cells 253-254 abut each other. For illustration, the multi-bit flip-flop circuit 42 includes cells 206 of bit 4 and 206 of bit 5, in which each has the width W3 and the cell height H2. In some embodiments, the cells 206 of bit 4 and 206 of bit 5 are configured with respect to, for example, the cell 201 of FIG. 2B. In some embodiments, the cells 206 of multi bits have the same equivalent circuit including, for example, the scan flip-flop 200 of FIG. 2A.

The cell 203 of bit 2, the cell 254, and the cell 203 of bit 7 are arranged in the cell row ROW3. The cell 202 of bit 3, the cell 253, and the cell 202 of bit 6 are arranged in the cell row ROW2. The cell 202 of bit 3, the cell 253, and the cell 202 of bit 6 are arranged in the cell row ROW2.

The configurations of FIGS. 4A-4B are given for illustrative purposes. Various implements are within the contemplated scope of the present disclosure. For example, in some embodiments, instead of having the cells 203 of bit 2 and 203 of bit 7, the multi-bit flip-flop circuit 42 includes a cell 202 of bit 2, the cell 254, and a cell 202 of bit 7 in the cell row ROW2 and cells 205 of bit 4 and 205 of bit 5 in the cell row ROW4.

Figure 5A:
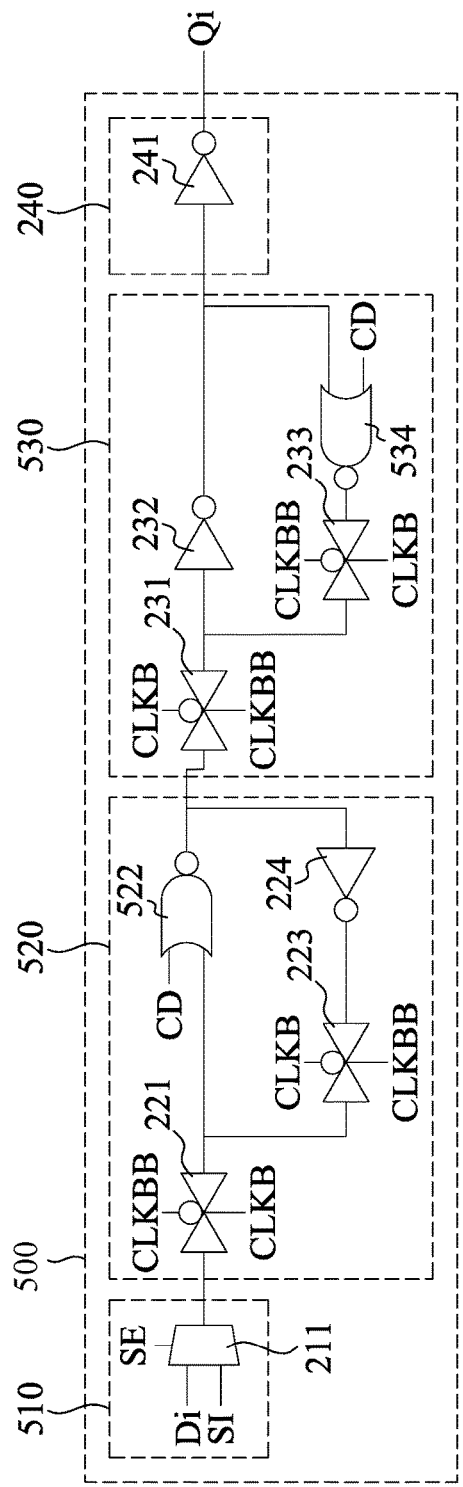
FIG. 5A is a schematic diagram of part of a scan flip-flop, in accordance with some embodiments.

Reference is now made to FIG. 5A. FIG. 5A is a schematic diagram of part of a scan flip-flop 500, in accordance with some embodiments. With respect to the embodiments of FIG. 2A, like elements in FIG. 5A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5B.

As illustratively shown in FIG. 5A, the scan flip-flop 500 includes a mux input circuit 510, a first latch circuit 520, a second latch circuit 530, and an output stage 540. In some embodiments, the mux input circuit 510 is configured with respect to, for example, the mux input circuit 210 of FIG. 2A. The first latch circuit 520 is configured with respect to, for example, the first latch circuit 220 of FIG. 2A. The second latch circuit 530 is configured with respect to, for example, the second latch circuit 230 of FIG. 2A. The output stage 540 is configured with respect to, for example, the output stage 240 of FIG. 2A.

Compared with the scan flip-flop 200 of FIG. 2A, instead of having the inverters 222 and 234, the scan flip-flop 500 includes an NOR gate 522 in the first latch circuit 520 and an NOR gate 534 in the second latch circuit 530. As illustratively shown in FIG. 5A, a first input terminal of the NOR gate 522 is coupled with the transmission gates 221 and 223, and a second input terminal of the NOR gate 522 is coupled to a control signal CD. A first input terminal of the NOR gate 534 is coupled with the inverters 232 and 241, and a second input terminal of the NOR gate 534 is coupled to a control signal CD. In some embodiments, the control signal CD is configured as a "Reset" signal which resets the output of the scan flip-flops to a particular logic state, (i.e., logic 1) at appropriate clock cycles.

In some embodiments, because of having the NOR gates 522 and 534, the scan flip-flop 500 of FIG. 5A occupies a greater area than the scan flip-flop 200 of FIG. 2A.

Figure 5B:
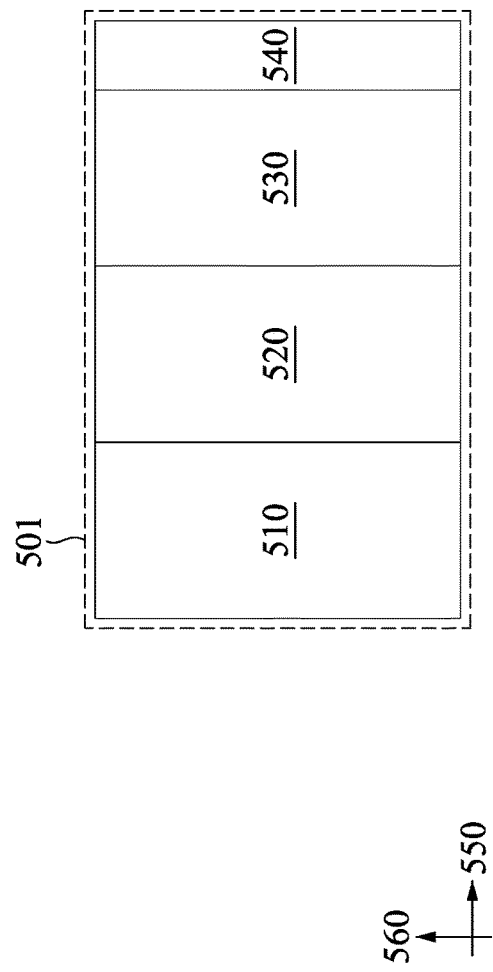
FIG. 5B is a layout view of the scan flip-flop of FIG. 5A, in accordance with some embodiments.

Reference is now made to FIG. 5B. With respect to FIG. 5A, like elements in FIG. 5B are designated with the same reference numbers for ease of understanding. As illustratively shown in FIG. 2B, the cell 501 includes the mux input circuit 510, the first latch circuit 520, the second latch circuit 530, and the output stage 540 that are arranged along a cell boundary direction 550. The configurations of the cell 501 corresponding to the scan flip-flop 500 are given for illustrative purposes. Various implements of the cell 501 are within the contemplated scope of the present disclosure. For example, in some embodiments, the mux input circuit 510, the first latch circuit 520, the second latch circuit 530, and the output stage 540 are arranged along both two cell boundary directions 550 and 560.

FIGS. 6A-6C are floor planning or layout views of several the scan flip-flops of FIGS. 2A-2B and several the scan flip-flops of FIGS. 5A-5B that are included in 4-bit flip-flop circuits 61-63 in the semiconductor device of FIG. 1A, in accordance with some embodiments.

Reference is now made to FIG. 6A. Compared with FIG. 3B, as shown in FIG. 6A, instead of having the cells 201 of bit 1 and 201 of bit 3, the multi-bit flip-flop 61 includes the cell 501 of bit 1 in the cell ROW1, the cell 501 of bit 3 in the cell ROW3, in which the cells 501 of bit 1 and 501 of bit 3 has the width W1 and the cell height H1.

Reference is now made to FIG. 6B. Compared with FIG. 6A, instead of having the cell rows with different cell heights being arranged interlaced, the cell rows ROW2 and ROW4 having greater cell height are arranged interposed between the cell rows ROW1 and ROW3 having smaller cell height in the multi-bit flip-flop circuit 62. Alternatively stated, the cell 501 of bit 4 in the cell row ROW3 is exchanged with the cell 202 of bit 3 and the cell 254 that are arranged in the cell row ROW4, and the cells 253-254 abut each other.

Reference is now made to FIG. 6C. Compared with FIG. 6B, instead of having the cell rows having greater cell height interposed between the cell rows having smaller cell height, the cell rows ROW1 and ROW3 are interposed between the cell rows ROW2 and ROW4.

The configurations of FIGS. 6A-6C are given for illustrative purposes. Various implements are included in the contemplated scope of the present disclosure. For example, the scan flip-flops corresponding to bits in multi-bit flip-flop circuit are arranged in sequence along one of cell boundaries which elongate in a direction perpetual to the direction in which the cells extend.

Figures 7A, 7B:
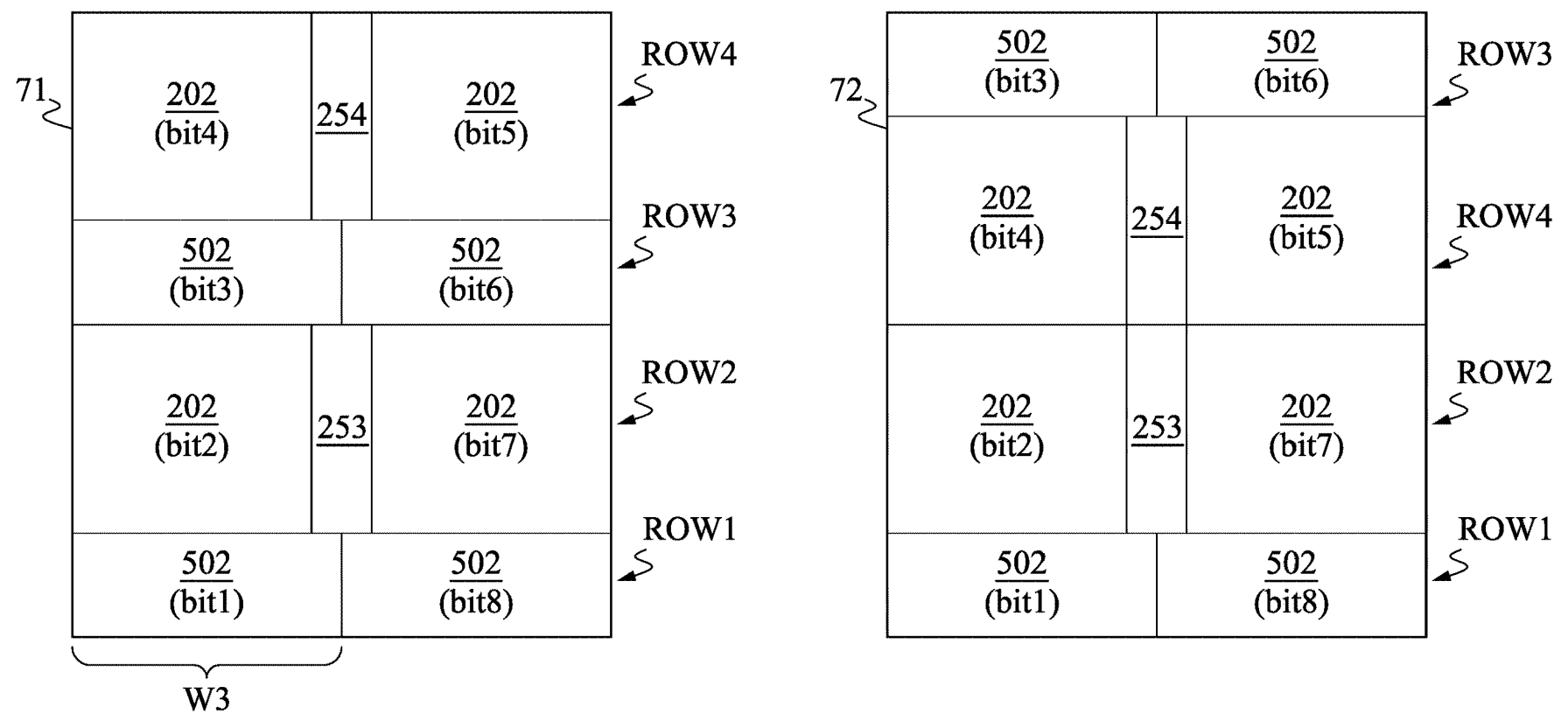

FIGS. 7A-7B are floor planning or layout views of several the scan flip-flops of FIGS. 2A-2B and several the scan flip-flops of FIGS. 5A-5B included in 8-bit flip-flop circuits 71-72 in the semiconductor device of FIG. 1A, in accordance with some embodiments. With respect to FIGS. 2A-6C, like elements in FIGS. 7A-7B are designated with the same reference numbers for ease of understanding.

Reference is now made to FIG. 7A. Compared with FIG. 4A, instead of having the cells 205 of bit 1, 205 of bit 3, 205 of bit 6, and 205 of bit 8, the multi-bit flip-flop circuit 71 includes cells 502 of bit 1, 502 of bit 3, 502 of bit 6, and 502 of bit 8. In some embodiments, the cells 502 of bit 1, 502 of bit 3, 502 of bit 6, and 502 of bit 8 are configured with respect to, for example, the cell 501 of FIG. 5B. In some embodiments, the cells 502 of multi bits have the same equivalent circuit including, for example, the scan flip-flop 500 of FIG. 5A.

Reference is now made to FIG. 7B. Compared with FIG. 7A, the cell row ROW3 is exchanged with the cell row ROW4. Specifically, the cell 202 of bit 4 is interposed between the cell 202 of bit 2 and the cell 502 of bit 3. The cell 202 of bit 5 is interposed between the cell 202 of bit 7 and the cell 502 of bit 6. The cells 253-254 abut each other.

With the configurations of FIGS. 6A-7B, clock drivers, such like the inverters in the clock cells 253-254, are centralized in the multi-bit flip-flop circuit and abut some scan flip-flop. Alternatively stated, instead of each scan flip-flop having its own pair of clock driver, signals of the clock drivers centralized in the multi-bit flip-flop circuit are shared by all the scan flip-flop in the multi-bit flip-flop circuit. Accordingly, the total area of multi-bit flip-flop circuit is reduced.

Moreover, with the configurations of FIGS. 6A-7B, scan flip-flops, corresponding to bits of multi-bit flip-flop, with different flop functions are integrated together in different cell architectures. In some embodiments, different cell architectures feature different computing speed. Accordingly, timing path for each bit will be characterized separately and the EDA tools will do optimization and put timing critical path in the faster cell architecture and less timing critical path in power optimized cell.

Figure 8A:
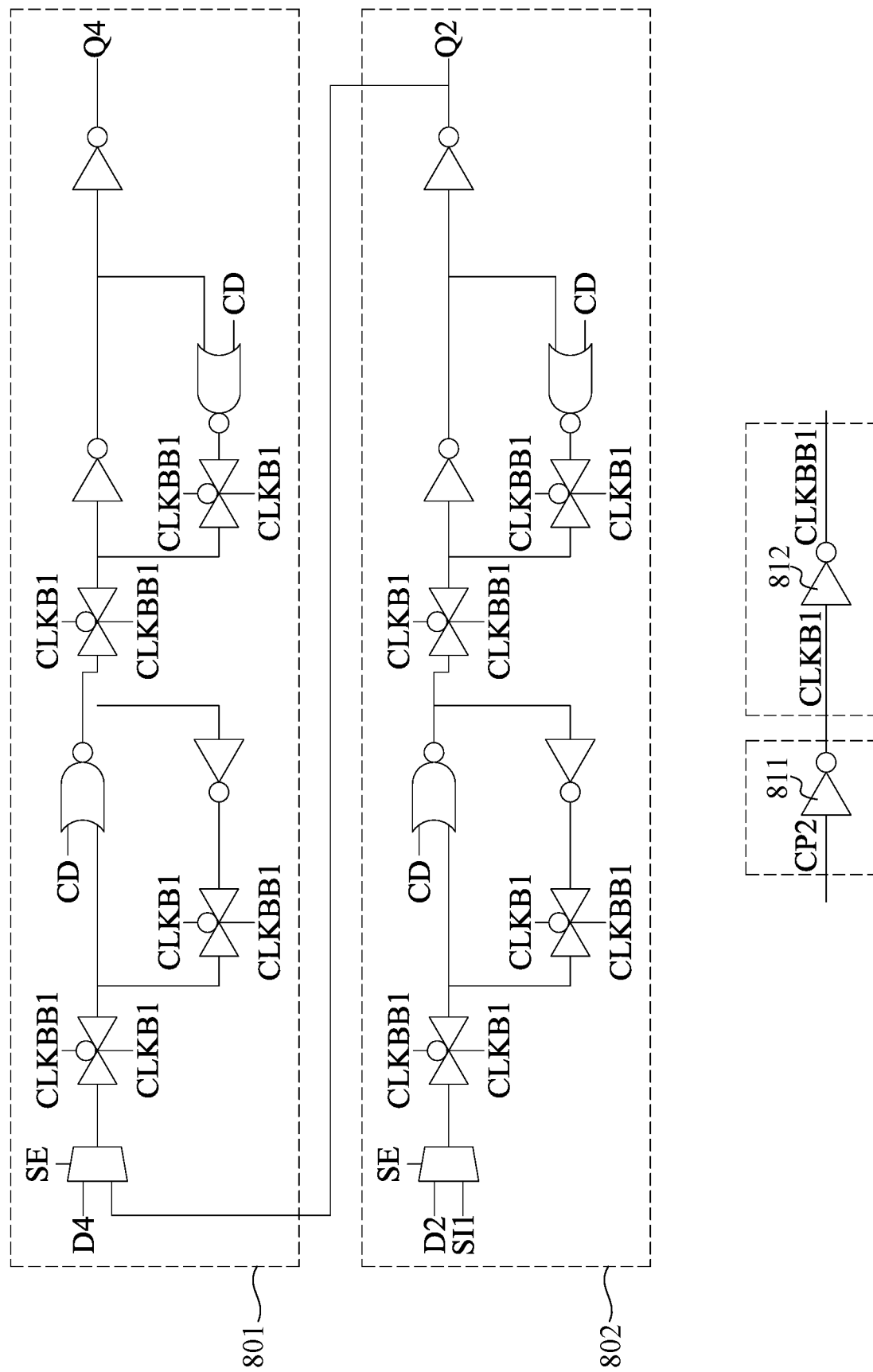
FIG. 8A is a schematic diagram of part of a first set of scan flip-flops corresponding to the scan flip-flop of FIG. 2A, in accordance with some embodiments.

Reference is now made to FIG. 8A. FIG. 8A is a schematic diagram of part of a first set of scan flip-flops 801-802 corresponding to the scan flip-flop 500 of FIG. 5A, in accordance with some embodiments. With respect to FIGS. 2A-7B, in FIG. 8A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 8A.

In some embodiments, each scan flip-flop in the first set of scan flip-flops 801-802 is configured with respect to, for example, the scan flip-flop 500 of FIG. 5A. The inverters 811-812 are configured with respect to, for example, the inverters 251-252 of FIG. 2A. As illustratively shown in FIG. 8A, the scan flip-flops 801-802 are configured to operate in response to an output signal CLKB1 of the inverter 811 and an output signal CLKBB1 of the inverter 812, while the scan flip-flop 802 receives the signal data input SI1. The clock signal CLKB1 is generated by the inverter 811 inverting the clock signal CP1, and the clock signal CLKBB1 is generated by the inverter 812 inverting the clock signal CLKB1. In some embodiments, the output data signal Q2 of the scan flip-flop 802 is received by the scan flip-flop 801, and the scan flip-flop 801 outputs the output data signal Q4.

Figure 8B:
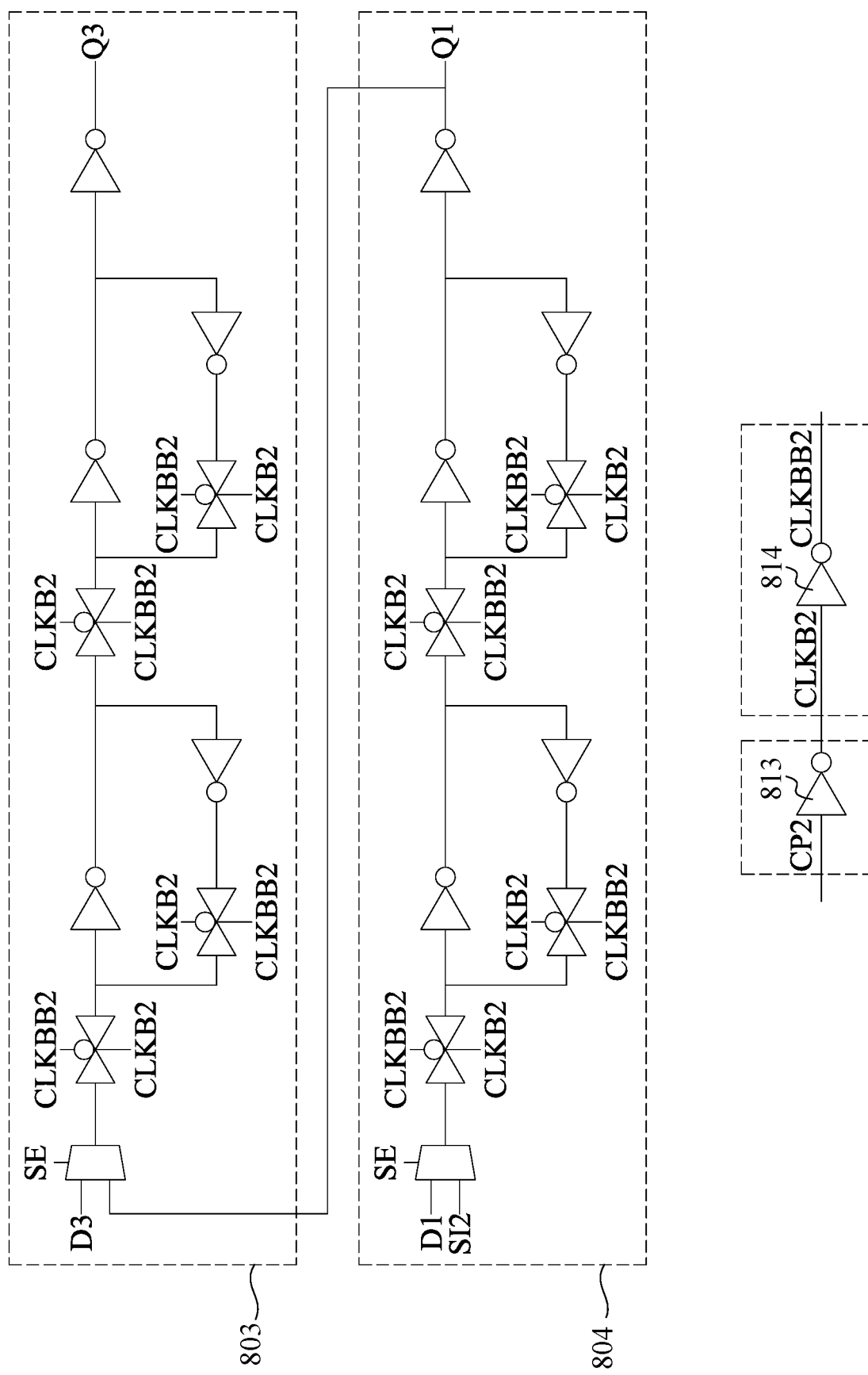
FIG. 8B is a schematic diagram of part of a second set of scan flip-flops corresponding to the scan flip-flop of FIG. 5A, in accordance with some embodiments.

Reference is now made to FIG. 8B. FIG. 8B is a schematic diagram of part of a second set of scan flip-flops 803-804 corresponding to the scan flip-flop 200 of FIG. 2A, in accordance with some embodiments. With respect to FIGS. 2A-8A, like elements in FIG. 8B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 8B.

In some embodiments, each scan flip-flop in the second set of scan flip-flops 803-804 is configured with respect to, for example, the scan flip-flop 200 of FIG. 2A. The inverters 813-814 are configured with respect to, for example, the inverters 251-252 of FIG. 2A. As illustratively shown in FIG. 8B, the scan flip-flop 803-804 are configured to operate in response to an output signal CLKB2 of the inverter 813 and an output signal CLKBB2 of the inverter 814, while the scan flip-flop 804 receives the signal data input SI2. The clock signal CLKB2 is generated by the inverter 813 inverting a clock signal CP2, and the clock signal CLKBB2 is generated by the inverter 814 inverting the clock signal CLKB2. In some embodiments, the output data signal Q1 of the scan flip-flop 804 is received by the scan flip-flop 803, and the scan flip-flop 803 outputs the output data signal Q3.

In some embodiments, the clock signals CP1 and CP2 are different. Accordingly, the first set of scan flip-flops 801-802 and the second set of scan flip-flops 803-804 have different timing characteristics. Alternatively stated, in some embodiments, the first set of scan flip-flops 801-802 and the second set of scan flip-flops 803-804 are configured to be in two independent multi-bit flip-flop circuits.

The configurations of FIGS. 8A-8B are given for illustrative purposes. Various implements are included in the contemplated scope of the present disclosure. For example, the clock signals CP1 and CP2 are the same. In various embodiments, the output data signals Q1-Q2 are not received by the scan flip-flops 801 and 803. Each of the scan flip-flops 801-804 receives the same signal data input SI.

FIGS. 9A-9C are floor planning or layout views of the first set of scan flip-flops 801-802 and the second set of scan flip-flops 803-804 that are included in 4-bit flip-flop circuits 91-93 in the semiconductor device of FIG. 1A, in accordance with some embodiments. With respect to FIGS. 2A-8B, like elements in FIGS. 9A-9C are designated with the same reference numbers for ease of understanding.

Reference is now made to FIG. 9A. The multi-bit flip-flop circuit 91 includes the cells 202-203, 503-504, a first pair of clock cells 815-816, and a second pair of clock cells 817-818. The cells 503-504 have a width W4 greater than the width W1 and the cell height H1. In some embodiments, the scan flip-flops 801-802 in the first set of scan flip-flops are arranged in the cells 504 of bit 4 and 503 of bit 2 respectively. The scan flip-flops 803-804 in the second set of scan flip-flops are arranged in the cells 202 of bit 3 and 203 of bit 1 respectively. For illustration, the 4-bit flip-flop circuit 91 includes cells 815-818. The cells 815-816 correspond to the inverters 813-814 of FIG. 8B respectively. The cells 817-818 correspond to the inverters 811-812 of FIG. 8A respectively.

As illustratively shown in FIG. 9A, the cells 203 of bit 1 and the first pair of clock cells 815-816 are arranged in the cell row ROW1. The cells 202 of bit 3 and the second pair of clock cells 817-818 are arranged in the cell row ROW2. The cell 503 of bit 2 is arranged in the cell row ROW3. The cell 504 of bit 4 is arranged in the cell row ROW4.

Reference is made to FIG. 9B. Compared with FIG. 9A, instead of having the cell 503 of bit 2 abutting the cell 202 of bit 3 and the second pair of clock cells 817-818, the cell 504 of bit 4 in the multi-bit flip-flop circuit 92 is arranged abutting the cell 202 of bit 3 and the second pair of clock cells 817-818, while the cell 503 of bit 2 is arranged on the opposite side of the cell 504 of bit 4.

Reference is now made to FIG. 9C. Compared with FIG. 9A, instead of arranging the cell 202 of bit 3 and the second pair of clock cells 817-818 abutting the cell 503 of bit 2, the cell 203 of bit 1 and the first pair of clock cells 815-816 of the multi-bit flip-flop circuit 93 are arranged abutting the cell 503 of bit 2, while the cell 202 of bit 3 and the second pair of clock cells 817-818 are arranged on the opposite side of the cell 203 of bit 1.

The configurations of FIGS. 9A-9C are given for illustrative purposes. Various implements are included in the contemplated scope of the present disclosure. For example, in some embodiments, the sequence of the cell rows ROW1-ROW4 is different from what have been shown in the embodiments of FIGS. 9A-9C.

Figure 10:
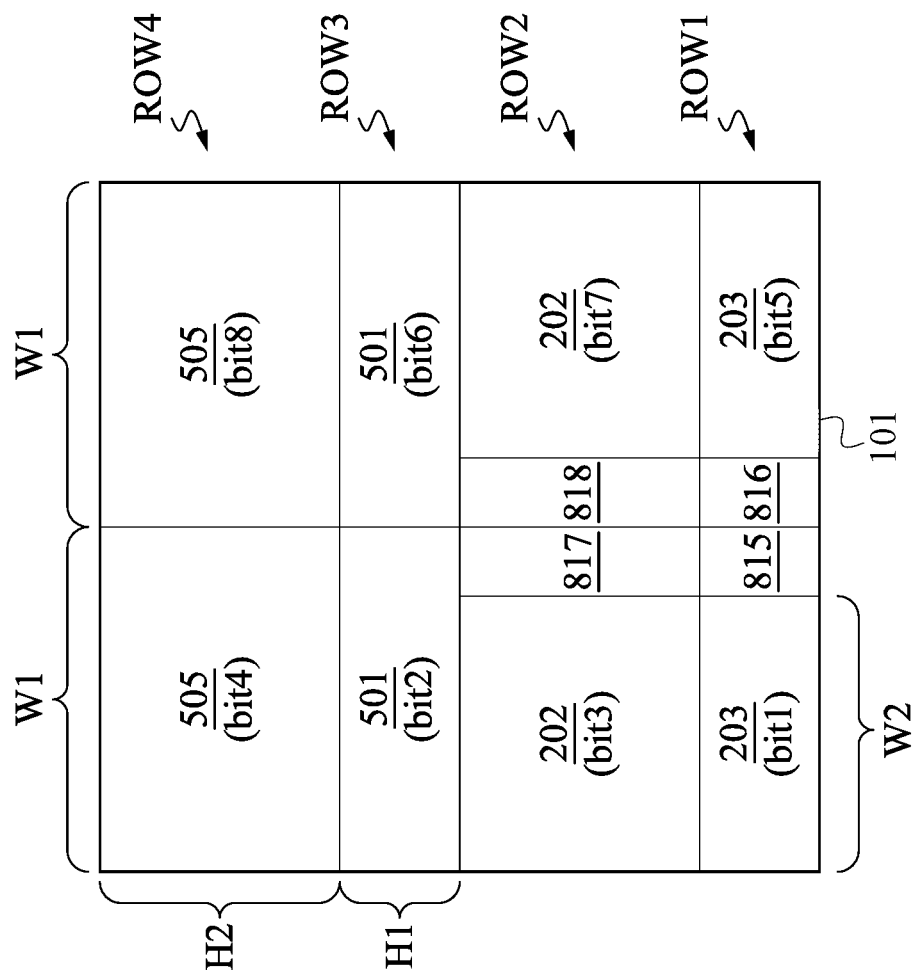
FIG. 10 is floor planning or layout views of the first set of scan flip-flops and the second set of scan flip-flops that are included in an 8-bit flip-flop circuit in the semiconductor device of FIG. 1A, in accordance with some embodiments.

Reference is now made to FIG. 10. FIG. 10 is floor planning or layout view of several first sets of scan flip-flops and several second sets of scan flip-flops that are included in a 8-bit flip-flop circuit 101 in the semiconductor device 10 of FIG. 1A, in accordance with some embodiments. With respect to FIGS. 2A-9C, like elements in FIG. 10 are designated with the same reference numbers for ease of understanding.

As shown in FIG. 10, compared with FIG. 9A, instead of having the cells 503 of bit 2 and 504 of bit 4, the multi-bit flip-flop circuit 101 includes cells 501 of bit 2, 505 of bit 4, 505 of bit 8, and 501 of bit 6. In some embodiments, the cells 505 of bit 4 and 505 of bit 8 have the width W1 and the cell height H2, and are configured with respect to, for example, the cell 501 of FIG. 5B. For illustration, the cells 505 of bit 4 and 505 of bit 8 are arranged in the cell row ROW4, and the cells 501 of bit 2 and 501 of bit 6 are arranged in the cell row ROW3.

In some embodiments, one of the first sets of scan flip-flops 801-802 corresponding to bit 2 and bit 4 are arranged in the cells 501 of bit 2 and 505 of bit 4, and the other one corresponding to bit 6 and bit 8 are arranged in the cells 501 of bit 6 and 505 of bit 8.

As illustratively shown in FIG. 10, the multi-bit flip-flop circuit 101 further includes cells 203 of bit 5 and 202 of bit 7. In some embodiments, one of the second sets of scan flip-flops 803-804 corresponding to bit 1 and bit 3 are arranged in the cells 203 of bit 1 and 202 of bit 3, and the other one corresponding to bit 5 and bit 7 are arranged in the cells 203 of bit 5 and 202 of bit 7.

The configurations of FIG. 10 are given for illustrative purposes. Various implements are included in the contemplated scope of the present disclosure. For example, in some embodiments, the sequence of the cell rows ROW1-ROW4 is different from what have been shown in the embodiments of FIG. 10.

With the configurations of FIGS. 9A-10, by utilizing two pairs of clock cells in mixed cell row architecture, the flexibility of arranging two independent multi-bit flip-flop circuits is provided and further the total area of multi-bit flip-flop circuits is reduced.

Figure 11:
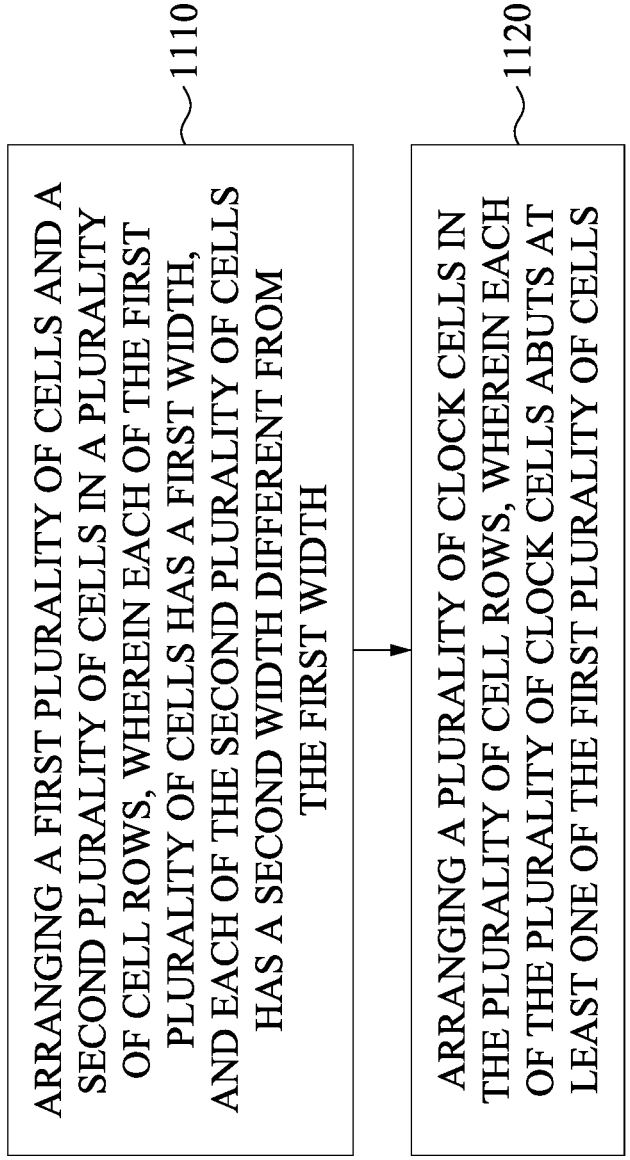
FIG. 11 is a flow chart of a method of generating a layout design for fabricating the integrated circuit, in accordance with some embodiments of the present disclosure.

FIG. 11 is a flow chart of a method 1100 of generating a layout design for fabricating an integrated circuit including the multi-bit flip-flop circuits 31-36, 41-42, 61, in accordance with some embodiments of the present disclosure. It is understood that additional operations can be provided before, during, and after the processes shown by FIG. 11, and some of the operations described below can be replaced or eliminated, for additional embodiments of the method. The order of the operations/processes may be interchangeable. Throughout the various views and illustrative embodiments, like reference numbers are used to designate like elements. The method 1100 includes operations 1110-1120 that are described below with reference to the multi-bit flip-flop circuit 61 of FIG. 6A.

In operation 1110, the cells 501 of bit 1, 501 of bit 3, 202 of bit 2, and 204 of bit 4 are arranged in the cell rows ROW1-ROW4. As shown in the embodiments of FIG. 6A, the cells 501 of bit 1, 501 of bit 3 have the width W1, and the cells 202 of bit 2, and 204 of bit 4 have the width W2 different from the width W1.

In some embodiments, the width W2 is smaller than the width W1.

In some embodiments, as mentioned above with respect to FIG. 6A, the scan flip-flops corresponding to the cells 501 and 202 have different functions. For example, scan flip-flop in the cell 501 is further configured to operate in response to the control signal CD, compared with the scan flip-flop in the cell 202.

In some embodiments, the cell rows ROW1 and ROW3 have the row height H1, and the cell rows ROW2 and ROW4 have the row height H2, in which the row height H1 is smaller than the row height H2.

In some embodiments, as shown in FIG. 6A, the cells 501 of bit 1 and 501 of bit 3 are arranged in the cell rows ROW1 and ROW3. The cell 202 of bit 2 and 204 of bit 4 are arranged in the cell rows ROW2 and ROW4.

In operation 1120, the clock cells 253-254 are arranged in the cell rows ROW2 and ROW4. In the embodiments of FIG. 6A, the clock cell 253 abuts the cell 202 of bit 2, and the clock cell 254 abuts the cell 204 of bit 4.

In various embodiments, as shown in FIG. 9A, the first pair of clock cells 815-816 are arranged in the cell row ROW1, and the second pair of clock cells 817-818 are arranged in the cell row ROW2 having the cell height different from that of the cell row ROW1.

In some embodiments, as shown in FIG. 6A, the cells 501 of bit 1, 501 of bit 3, 202 of bit 2, 204 of bit 4, the clock cells 253-254 are included in a standard cell operating as the multi-bit flip-flop circuit 61.

Figure 12:
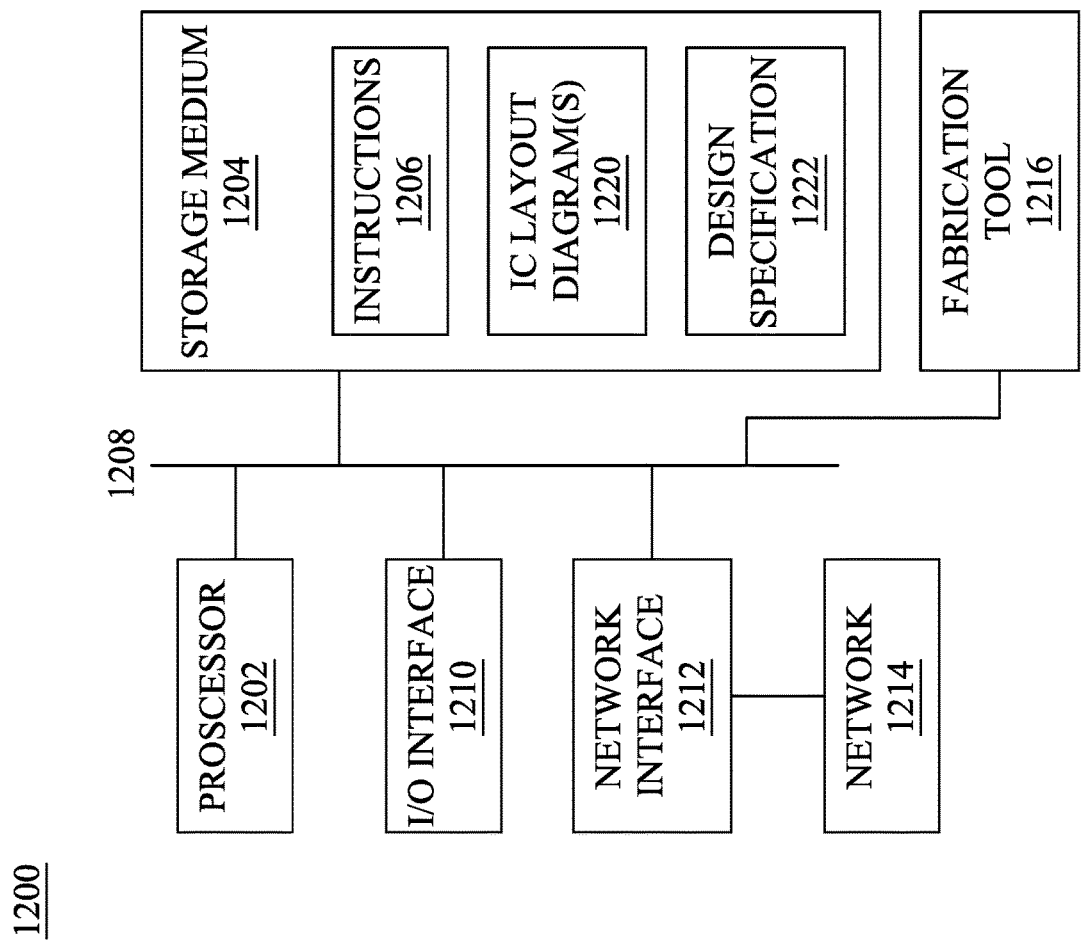
FIG. 12 is a block diagram of a system for designing the integrated circuit layout design, in accordance with some embodiments of the present disclosure.

Reference is now made to FIG. 12. FIG. 12 is a block diagram of an electronic design automation (EDA) system 1200 for designing the integrated circuit layout design, in accordance with some embodiments of the present disclosure. EDA system 1200 is configured to implement one or more operations of the method 1100 disclosed in FIG. 11, and further explained in conjunction with FIGS. 1A-10. In some embodiments, EDA system 1200 includes an APR system.

In some embodiments, EDA system 1200 is a general purpose computing device including a hardware processor 1202 and a non-transitory, computer-readable storage medium 1204. Storage medium 1204, amongst other things, is encoded with, i.e., stores, computer program code (instructions) 1206, i.e., a set of executable instructions. Execution of instructions 1206 by hardware processor 1202 represents (at least in part) an EDA tool which implements a portion or all of, e.g., the method 1200.

The processor 1202 is electrically coupled to computer-readable storage medium 1204 via a bus 1208. The processor 1202 is also electrically coupled to an I/O interface 1210 and a fabrication tool 1216 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. The processor 1202 is configured to execute computer program code 1206 encoded in computer-readable storage medium 1204 in order to cause EDA system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause EDA system 1200 (where such execution represents (at least in part) the EDA tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores IC layout diagram 1220 of standard cells including such standard cells as disclosed herein, for example, cells corresponding to the multi-bit flip-flop circuits 31-36, 41-42, 61-63, 71-72, 91-93, and 101 discussed above with respect to FIGS. 1A-10.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows EDA system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1264. In one or more embodiments, a portion or all of noted processes and/or methods are implemented in two or more systems 1200.

EDA system 1200 also includes the fabrication tool 1216 coupled to processor 1202. The fabrication tool 1216 is configured to fabricate integrated circuits, e.g., the multi-bit flip-flop circuits 31-36, 41-42, 61-63, 71-72, 91-93, and 101 discussed above with respect to FIGS. 1A-10, according to the design files processed by the processor 1202.

EDA system 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a UI through I/O interface 1210. The information is stored in computer-readable medium 1204 as design specification 1222.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods are implemented as a software application that is a portion of an EDA tool. In some embodiments, a portion or all of the noted processes and/or methods are implemented as a software application that is used by EDA system 1200. In some embodiments, a layout diagram which includes standard cells is generated using a suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 13:
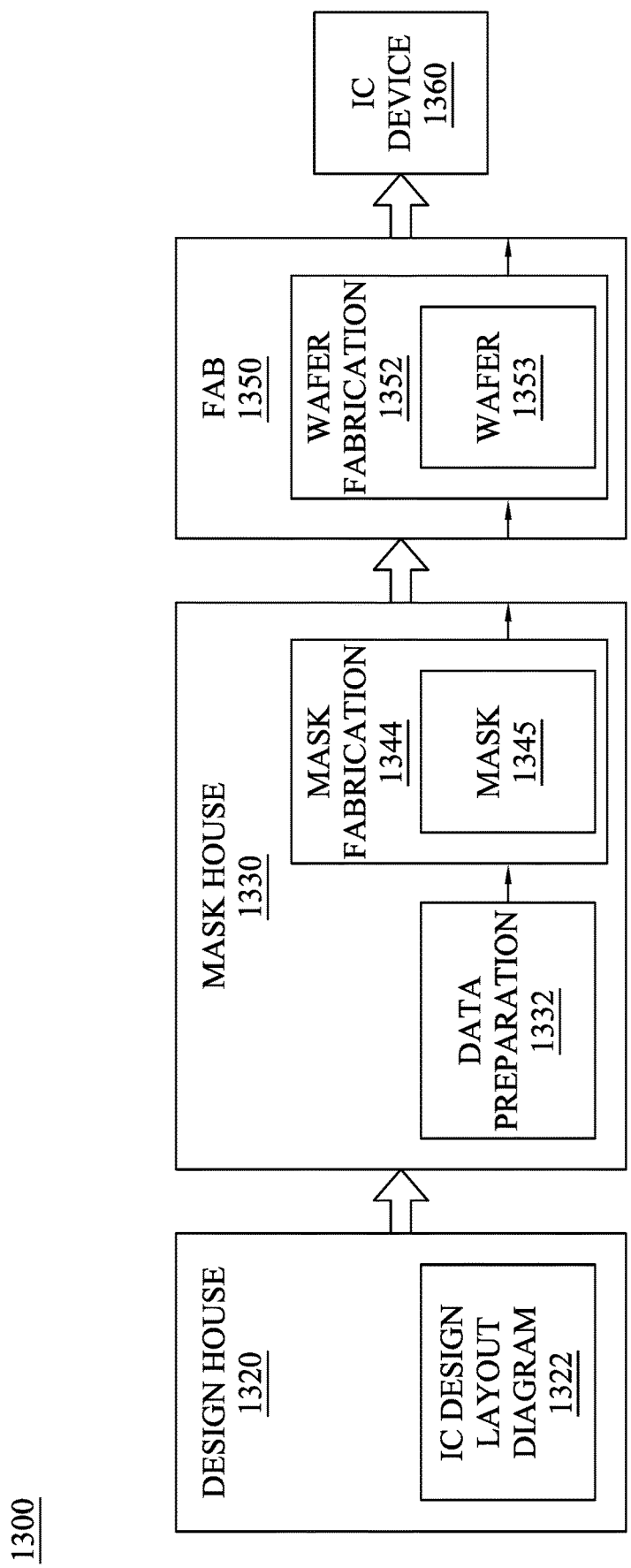
FIG. 13 is a block diagram of an integrated circuit manufacturing system, and an integrated circuit manufacturing flow associated therewith, in accordance with some embodiments.

FIG. 13 is a block diagram of IC manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1300.

In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in IC manufacturing system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single entity. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns, for example, an IC layout design depicted in FIGS. 3A-4B, 6A-7B, and/or 9A-10, designed for an IC device 1360, for example, integrated circuits 100 and 700 discussed above with respect to FIGS. 3A-4B, 6A-7B, and/or 9A-10. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design or place and route. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The IC design layout diagram 1322 is manipulated by mask data preparation 1332 to comply with particular characteristics of the mask writer and/or requirements of IC fab 1350. In FIG. 13, data preparation 1332 and mask fabrication 1344 are illustrated as separate elements. In some embodiments, data preparation 1332 and mask fabrication 1344 can be collectively referred to as mask data preparation.

In some embodiments, data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of data preparation 1332 has been simplified for the purposes of clarity. In some embodiments, data preparation 1332 includes additional features such as a logic operation (LOP) to modify the IC design layout diagram 1322 according to manufacturing rules. Additionally, the processes applied to IC design layout diagram 1322 during data preparation 1332 may be executed in a variety of different orders.

After data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1345 includes a transparent substrate (for example, fused quartz) and an opaque material (for example, chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 includes wafer fabrication 1352. IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multi-level interconnects, and the like (formed at subsequent manufacturing steps).

As described above, integrated circuits in the present disclosure provide multi-bit flip flop architecture arranged in hybrid cell rows. By placing cells with different cell architectures and functions in cell rows with different cell heights, the area overhead is reduced and the flexibility of timing characteristics is provided.

In some embodiments, an integrated circuit is disclosed, including a first plurality of cell rows; a second plurality of cell rows arranged abutting the first plurality of cell rows, in which a first number of fins in the first plurality of cell rows is different from a second number of fins in the second plurality of cell rows; first and second clock inverters arranged in the second plurality of cell rows, in which a first clock signal generated by the first clock inverter and a second clock signal generated by the second clock inverter have different phases; and several flip-flops arranged in the first plurality of cell rows and the second plurality of cell rows, in which the flip-flops comprise a first plurality of flip-flops configured to operate in response to the first and second clock signals. In some embodiments, the first number of fins is smaller than the second number of fins. In some embodiments, the first number of fins equals to one and the second number of fins equals to two. In some embodiments, the second plurality of cell rows abut to each other and are interposed between at least two of the first plurality of cell rows. In some embodiments, the plurality of flip-flops further comprise: a second plurality of flip-flops different from the first plurality of flip-flops, wherein the second plurality of flip-flops are configured to operate in response to the first clock and second clock signals; wherein the first plurality of flip-flops are arranged in the second plurality of cell rows, and the second plurality of flip-flops are arranged in the first plurality of cell rows. In some embodiments, the integrated circuit further comprises third and fourth clock inverters arranged in a first row of the first plurality of cell rows, wherein the third clock inverter are arranged abutted one, arranged in the first row of the first plurality of cell rows, of the first plurality of flip-flops. In some embodiments, the plurality of flip-flops further comprise a second plurality of flip-flops; wherein the second plurality of flip-flops are configured to operate in response to output signals of the third and fourth inverters.

Also disclosed is an integrated circuit that includes a first flip-flop arranged in a first cell and a second flip-flop arranged in a second cell; a third flip-flop arranged in a third cell and a fourth flip-flop arranged in a fourth cell; and a first inverter arranged in a first clock cell and a second inverter arranged in a second clock cell; in which the first and second cells have a first height, and the third and fourth cells and the first and second clock cells have a second height greater the first height; in which the first clock cell abuts the third cell, and the third cell abuts the first cell, the fourth cell, or the combination thereof. In some embodiments, the second clock cell abuts the fourth cell. In some embodiments, the first and second clock cells abut each other. In some embodiments, the first and third flip-flop comprises different circuit configurations, in which the first flip-flop is configured to be enabled in response to a reset signal. In some embodiments, the integrated circuit further includes a third inverter arranged in a third clock cell and a fourth inverter arranged in a fourth clock cell; in which the third and fourth clock cells have the first height, and abut each other. In some embodiments, the first and second clock cells and the third cell are arranged in a first cell row having the second height, and the third and fourth clock cells and the first cell are arranged in a second cell row having the first height. In some embodiments, the first and third flip-flops are configured to operate in response to output signals of the first and second inverters, and the second and fourth flip-flops are configured to operate in response to output signals of the third and fourth inverters. In some embodiments, the integrated circuit further includes a fifth flip-flop arranged in a fifth cell and a sixth flip-flop arranged in a sixth cell, in which the fifth and sixth cells have the first height; and a seventh flip-flop arranged in a seventh cell and a eighth flip-flop arranged in a eighth cell, in which the seventh and eighth cells have the second height; in which the first clock cell is arranged interposed between the third and seventh cells, and the second clock cell is arranged interposed between the fourth and eighth cells. In some embodiments, the first inverter is configured to generate a first inverted signal from a clock signal, and the second inverter is configured to generate a second inverted signal from the first inverted signal; in which the first to eighth flip-flops are configured to operate in response to the first and second inverted signals.

Also disclosed is a method including arranging a first plurality of cells, a second plurality of cells, and a plurality of clock cells in a plurality of cell rows. Each of the first plurality of cells has a first width, and each of the second plurality of cells has a second width different from the first width. Each of the plurality of clock cells abuts at least one of the first plurality of cells. The first and second plurality of cells and the plurality of clock cells are included in a standard cell operating as a multi bit flip-flop circuit. In some embodiments, the first width is smaller than the second width, and the first and second plurality of cells have different functions. In some embodiments, the plurality of cell rows comprise a first plurality of cell rows each having a first height and a second plurality of rows each having a second height smaller than the first height; in which the method further comprises arranging the first plurality of cells having a first type of function in the first plurality of cell rows; and arranging the second plurality of cells having a second type of function in the second plurality of cell rows. In some embodiments, the plurality of clock cells comprise a first pair of clock cells and a second pair of clock cells, and the plurality of cell rows comprise a first plurality of cell rows each having a first height and a second plurality of rows each having a second height smaller than the first height; in which the method further comprises: arranging the first pair of clock cells and one cell of the first plurality of cells in one of the first plurality of cell rows; and arranging the second pair of clock cells and another cell of the first plurality of cells in one of the second plurality of cell rows.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a first plurality of cell rows;
   a second plurality of cell rows arranged abutting the first plurality of cell rows, wherein a first number of fins in the first plurality of cell rows is different from a second number of fins in the second plurality of cell rows;
   first and second clock inverters arranged in the second plurality of cell rows, wherein a first clock signal generated by the first clock inverter and a second clock signal generated by the second clock inverter have different phases; and
   a plurality of flip-flops arranged in the first plurality of cell rows and the second plurality of cell rows, wherein the plurality of flip-flops comprise a first plurality of flip-flops configured to operate in response to the first and second clock signals.

2. The integrated circuit of claim 1, wherein the first number of fins is smaller than the second number of fins.

3. The integrated circuit of claim 1, wherein the first number of fins equals to one and the second number of fins equals to two.

4. The integrated circuit of claim 1, wherein the second plurality of cell rows abut to each other and are interposed between at least two of the first plurality of cell rows.

5. The integrated circuit of claim 1, wherein the plurality of flip-flops further comprise:
   a second plurality of flip-flops different from the first plurality of flip-flops, wherein the second plurality of flip-flops are configured to operate in response to the first and second clock signals;
   wherein the first plurality of flip-flops are arranged in the second plurality of cell rows, and the second plurality of flip-flops are arranged in the first plurality of cell rows.

6. The integrated circuit of claim 1, further comprising:
   third and fourth clock inverters arranged in a first row of the first plurality of cell rows, wherein the third clock inverter is arranged abutted one, arranged in the first row of the first plurality of cell rows, of the first plurality of flip-flops.

7. The integrated circuit of claim 6, wherein the plurality of flip-flops further comprise:
   a second plurality of flip-flops;
   wherein the second plurality of flip-flops are configured to operate in response to output signals of the third and fourth clock inverters.

8. An integrated circuit, comprising:
   a first flip-flop arranged in a first cell and a second flip-flop arranged in a second cell;
   a third flip-flop arranged in a third cell and a fourth flip-flop arranged in a fourth cell; and
   a first inverter arranged in a first clock cell and a second inverter arranged in a second clock cell;
   wherein the first and second cells have a first height, and the third and fourth cells and the first and second clock cells have a second height greater than the first height;
   wherein the first clock cell abuts the third cell, and the third cell abuts the first cell, the fourth cell, or the combination thereof.

9. The integrated circuit of claim 8, wherein the second clock cell abuts the fourth cell.

10. The integrated circuit of claim 8, wherein the first and second clock cells abut each other.

11. The integrated circuit of claim 8, wherein the first and third flip-flops comprise different circuit configurations, wherein the first flip-flop is configured to be enabled in response to a reset signal.

12. The integrated circuit of claim 8, further comprising:
   a third inverter arranged in a third clock cell and a fourth inverter arranged in a fourth clock cell;
   wherein the third and fourth clock cells have the first height, and abut each other.

13. The integrated circuit of claim 12, wherein the first and second clock cells and the third cell are arranged in a first cell row having the second height, and the third and fourth clock cells and the first cell are arranged in a second cell row having the first height.

14. The integrated circuit of claim 13, wherein the first and third flip-flops are configured to operate in response to output signals of the first and second inverters, and
   the second and fourth flip-flops are configured to operate in response to output signals of the third and fourth inverters.

15. The integrated circuit of claim 8, further comprising:
   a fifth flip-flop arranged in a fifth cell and a sixth flip-flop arranged in a sixth cell, wherein the fifth and sixth cells have the first height; and
   a seventh flip-flop arranged in a seventh cell and an eighth flip-flop arranged in an eighth cell, wherein the seventh and eighth cells have the second height;
   wherein the first clock cell is arranged interposed between the third and seventh cells, and the second clock cell is arranged interposed between the fourth and eighth cells.

16. The integrated circuit of claim 15, wherein the first inverter is configured to generate a first inverted signal from a clock signal, and the second inverter is configured to generate a second inverted signal from the first inverted signal;
   wherein the first to eighth flip-flops are configured to operate in response to the first and second inverted signals.

17. A method, comprising:
   arranging a first plurality of cells, a second plurality of cells, and a plurality of clock cells in a plurality of cell rows,
   wherein each of the first plurality of cells has a first width, and each of the second plurality of cells has a second width different from the first width;
   wherein each of the plurality of clock cells abuts at least one of the first plurality of cells;
   wherein the first and second plurality of cells and the plurality of clock cells are included in a standard cell operating as a multi bit flip-flop circuit.

18. The method of claim 17, wherein the first width is smaller than the second width, and the first and second plurality of cells have different functions.

19. The method of claim 17, wherein the plurality of cell rows comprise a first plurality of cell rows each having a first height and a second plurality of cell rows each having a second height smaller than the first height;
   wherein the method further comprises:
     arranging the first plurality of cells having a first type of function in the first plurality of cell rows; and
     arranging the second plurality of cells having a second type of function in the second plurality of cell rows.

20. The method of claim 17, wherein the plurality of clock cells comprise a first pair of clock cells and a second pair of clock cells, and
- the plurality of cell rows comprise a first plurality of cell rows each having a first height and a second plurality of cell rows each having a second height smaller than the first height;

wherein the method further comprises:
- arranging the first pair of clock cells and one cell of the first plurality of cells in one of the first plurality of cell rows; and
- arranging the second pair of clock cells and another cell of the first plurality of cells in one of the second plurality of cell rows.

\* \* \* \* \*